United States Patent
Lee et al.

(10) Patent No.: US 12,336,410 B2
(45) Date of Patent: Jun. 17, 2025

(54) ORGANIC LIGHT EMITTING DISPLAY APPARATUS HAVING PIXELS OF DIFFERENT STRUCTURES

(71) Applicant: LG Display Co., Ltd., Seoul (KR)

(72) Inventors: Jaeho Lee, Seoul (KR); Wonhoe Koo, Goyang-si (KR); Dongmin Sim, Paju-si (KR); Taemin Kim, Paju-si (KR); Hyekyung Choi, Seoul (KR); Kyunghoon Han, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/603,852

(22) Filed: Mar. 13, 2024

(65) Prior Publication Data

US 2024/0224689 A1 Jul. 4, 2024

Related U.S. Application Data

(63) Continuation of application No. 17/117,702, filed on Dec. 10, 2020, now Pat. No. 11,974,480.

(30) Foreign Application Priority Data

Dec. 31, 2019 (KR) .................. 10-2019-0179655

(51) Int. Cl.
*H10K 59/35* (2023.01)
*H10K 50/15* (2023.01)
(Continued)

(52) U.S. Cl.
CPC .......... *H10K 59/353* (2023.02); *H10K 50/15* (2023.02); *H10K 50/81* (2023.02); *H10K 59/351* (2023.02); *H10K 2102/351* (2023.02)

(58) Field of Classification Search
CPC ...... H10K 50/15; H10K 50/81; H10K 50/826; H10K 50/84
See application file for complete search history.

(56) References Cited

U.S. PATENT DOCUMENTS

| 2012/0001206 A1 | 1/2012 | Jeong et al. |
| 2016/0111674 A1* | 4/2016 | Bae ................... H10K 50/17 |
| | | 257/40 |

(Continued)

FOREIGN PATENT DOCUMENTS

| CN | 106409860 A | 2/2017 |
| CN | 107833975 A | 3/2018 |

(Continued)

*Primary Examiner* — Suberr L Chi
(74) *Attorney, Agent, or Firm* — Birch, Stewart, Kolasch & Birch, LLP

(57) ABSTRACT

An organic light emitting display apparatus can include a substrate including a plurality of pixels, a transistor on the substrate, an over coating layer on the transistor, a plurality of organic light emitting diodes on the over coating layer corresponding to the plurality of pixels, an encapsulation layer on the plurality of organic light emitting diodes, an adhesive member on the encapsulation layer, and an encapsulation substrate on the adhesive layer. Also, the plurality of pixels include at least first, second and third pixels that emit different color lights, and each of the plurality of organic light emitting diodes includes a first electrode on the over coating layer, a light emitting portion on the first electrode, and a second electrode on the light emitting portion. Also, the light emitting portion includes a first light emitting portion and a second light emitting portion, and elements have certain thicknesses and spatial arrangements.

19 Claims, 17 Drawing Sheets

(51) Int. Cl.
  *H10K 50/81* (2023.01)
  *H10K 102/00* (2023.01)

(56) References Cited

U.S. PATENT DOCUMENTS

| | | |
|---|---|---|
| 2017/0033309 A1 | 2/2017 | Song et al. |
| 2018/0062103 A1 | 3/2018 | Kim et al. |
| 2018/0188866 A1* | 7/2018 | Heo .................... G06F 3/0412 |
| 2018/0247982 A1 | 8/2018 | Kim et al. |
| 2019/0043931 A1 | 2/2019 | Yim et al. |

FOREIGN PATENT DOCUMENTS

| | | |
|---|---|---|
| CN | 108511484 A | 9/2018 |
| CN | 109390375 A | 2/2019 |
| KR | 10-2006-0079194 A | 7/2006 |
| KR | 10-2009-0087274 A | 8/2009 |

\* cited by examiner

ORGANIC LIGHT EMITTING DISPLAY APPARATUS HAVING PIXELS OF DIFFERENT STRUCTURES

CROSS-REFERENCE TO RELATED APPLICATIONS

This application is a Continuation of U.S. application Ser. No. 17/117,702, filed on Dec. 10, 2020, which claims priority to Korean Patent Application No. 10-2019-0179655 filed on Dec. 31, 2019 in the Korean Intellectual Property Office, the entire contents of all these applications are hereby incorporated herein by reference into the present application.

BACKGROUND

Technical Field

The present disclosure relates to an organic light emitting display apparatus, and more particularly, to an organic light emitting display apparatus which minimizes a color change and a luminance change according to a viewing angle.

Description of the Related Art

Organic light emitting display apparatuses do not need a separate light source, which is different from a liquid crystal display apparatus. Therefore, the organic light emitting display apparatus can be manufactured to have a light weight and a small thickness. Further, since the organic light emitting display apparatus is driven at a low voltage, it is advantageous not only in terms of power consumption, but also in terms of a color implementation, a response speed, a viewing angle, and a contrast ratio (CR). Therefore, the light emitting display apparatus is being studied as the next generation displays.

The organic light emitting display apparatus is a self-emitting display apparatus and uses an organic light emitting diode in which electrons and holes from a cathode for injecting electrons and an anode for injecting holes are injected into a light emitting layer and excitons formed by coupling the injected electrons and holes are dropped from an excited state to a ground state to emit light.

The organic light emitting display apparatus can be classified into a top emission type, a bottom emission type, and a dual emission type depending on a direction in which light is emitted and can also be classified into a passive matrix type and an active matrix type depending on a driving method.

SUMMARY

Inventors of the present disclosure developed an organic light emitting diode having a multi-stack structure which uses a stack of a plurality of light emitting portions to implement an improved efficiency and lifespan characteristic of an organic light emitting display apparatus.

In the organic light emitting diode having a multi-stack structure, an emission area in which light is emitted by recombination of electrons and holes is located in each of the plurality of light emitting portions. Therefore, the organic light emitting diode including a multi-stack structure has a high efficiency and is driven at a low current so that the lifespan of the organic light emitting diode could be improved.

However, the inventors of the present disclosure recognized that when the organic light emitting diodes including the same structure are applied to all of the plurality of pixels which emit different color light, colors are changed or luminance is changed depending on a viewing angle in a specific pixel. For example, there was a problem in that an optimized structure could not be applied to the pixels which emit different color light so that a display quality was degraded.

Accordingly, the inventors of the present disclosure invented an improved organic light emitting display apparatus in which different structures are applied to individual pixels which emit different color light.

An aspect of the present disclosure is to provide an organic light emitting display apparatus which configures a thickness of a first electrode of a first pixel and a thickness of a first electrode of a second pixel to be different from each other to improve a color viewing angle characteristic.

Another aspect of the present disclosure is to provide an organic light emitting display apparatus which configures a thickness of a first electrode of a second pixel and a thickness of a first electrode of a third pixel to be different from each other to improve a luminance viewing angle characteristic.

Another aspect of the present disclosure is to provide an organic light emitting display apparatus which improves a display quality while minimizing a photo process.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

According to an embodiment of the present disclosure, there is provided an organic light emitting display apparatus. The organic light emitting display apparatus includes a substrate including a plurality of pixels. The organic light emitting display apparatus further includes a plurality of organic light emitting diodes disposed on the substrate so as to correspond to the plurality of pixels. The plurality of pixels includes a first pixel, a second pixel, a third pixel, and a fourth pixel which emit different color light. Each of the plurality of organic light emitting diodes includes a first electrode, a light emitting portion on the first electrode and a second electrode on the light emitting portion. A thickness of the first electrode of the first pixel is different from a thickness of the first electrode of the second pixel, and the thickness of the first electrode of the second pixel is different from a thickness of the first electrode of the third pixel.

According to another embodiment of the present disclosure, there is provided an organic light emitting display apparatus. The organic light emitting display apparatus includes a substrate including a plurality of pixels. The organic light emitting display apparatus further includes a plurality of organic light emitting diodes disposed on the substrate so as to correspond to the plurality of pixels. The plurality of pixels includes a white pixel, a red pixel, a green pixel, and a blue pixel. Each of the plurality of organic light emitting diodes includes a first electrode, a first light emitting portion which is disposed on the first electrode and includes a blue light emitting layer, a second light emitting portion which is disposed on the first light emitting portion and includes a red light emitting layer and two yellow-green light emitting layers, a third light emitting portion which is disposed on the second light emitting portion and includes a blue light emitting layer and a second electrode on the third light emitting portion. A thickness of the first electrode of the white pixel is different from a thickness of the first electrode of the red pixel, and the thickness of the first electrode of the red pixel is different from a thickness of the first electrode of the green pixel.

According to another embodiment of the present disclosure, an organic light emitting display apparatus comprises: a substrate including a plurality of pixels; and a plurality of organic light emitting diodes disposed on the substrate so as to correspond to the plurality of pixels respectively, wherein the plurality of pixels includes a first pixel, a second pixel, a third pixel, and a fourth pixel, and emits different color lights, and each pixel of the plurality of pixels includes a micro cavity structure corresponding to the light emitted from the pixel, wherein each of the plurality of organic light emitting diodes includes a first electrode; a light emitting portion on the first electrode; and a second electrode on the light emitting portion, wherein the micro cavity structure of the first pixel is different from the micro cavity structure of the second pixel, and the micro cavity structure of the second pixel is different from the micro cavity structure of the third pixel.

Other devices, systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

According to some embodiments of the present disclosure, a thickness of an anode of a white pixel and a thickness of an anode of a red pixel are configured to be different from each other to minimize a color change according to a viewing angle.

According to some embodiments of the present disclosure, a thickness of an anode of a red pixel and a thickness of an anode of a green pixel are configured to be different from each other to minimize a luminance change according to a viewing angle.

According to some embodiments of the present disclosure, thicknesses of anodes of pixels which emit different color light are configured to be different from each other with a minimum process to improve a display quality.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
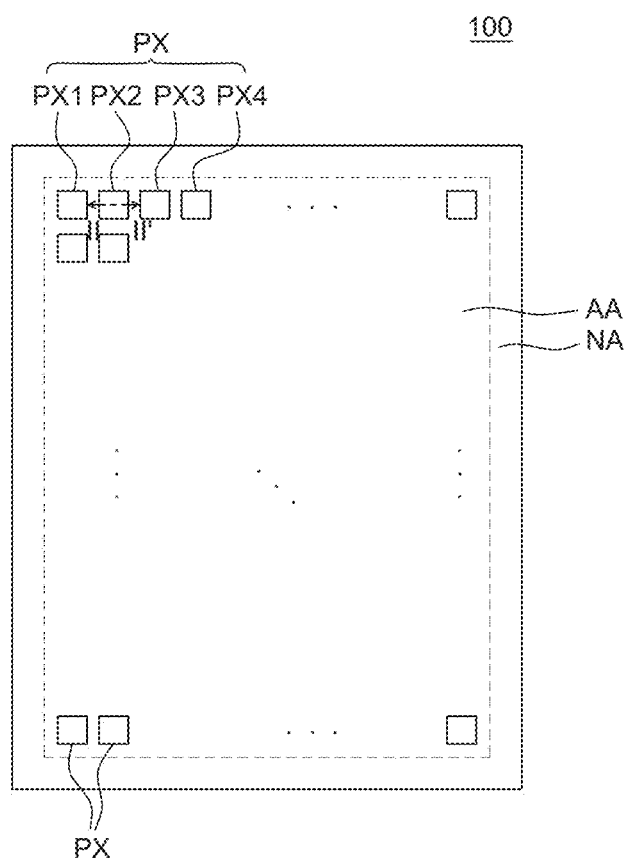
FIG. 1 is a plan view of an organic light emitting display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided byway of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on," "above," "below," and "next," one or more parts can be positioned between the two parts unless the terms are used with the term "immediately" or "directly".

When an element or layer is disposed "on" another element or layer, another layer (or multiple layers) or another element (or multiple elements) can be interposed directly on the other element or therebetween.

Although the terms "first," "second," and the like are used for describing various components, these components are not confined by these terms. These terms are merely used for distinguishing one component from the other components and may not define any order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Figure 2:
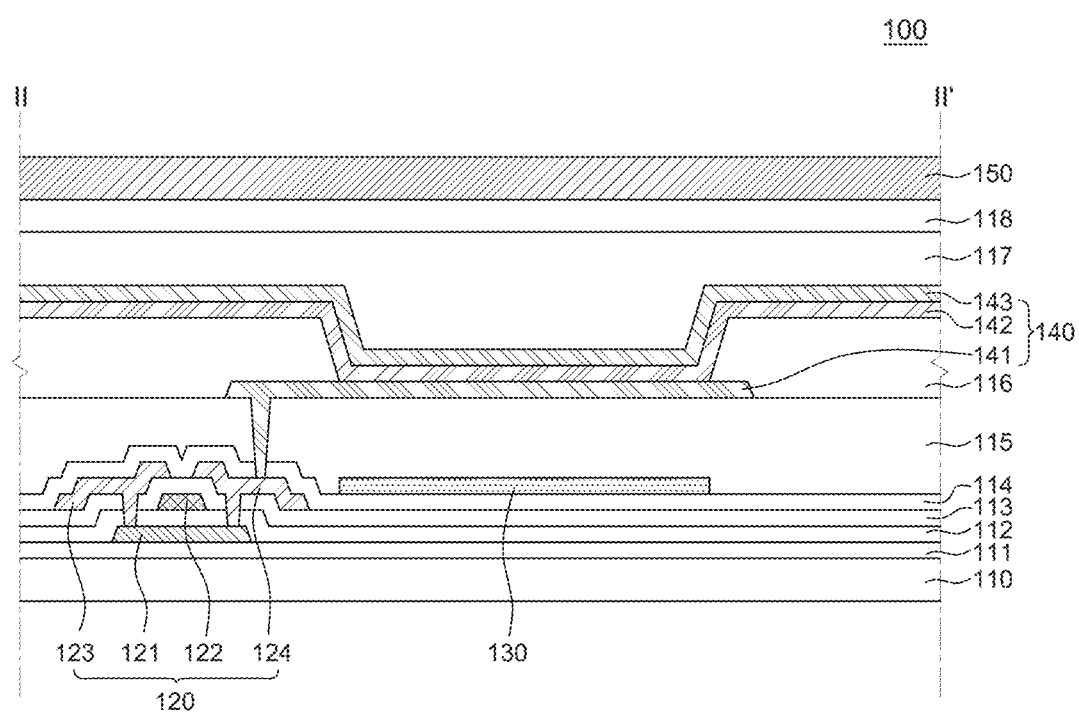
FIG. 2 is a cross-sectional view taken along the line II-II' of FIG. 1.

FIG. 1 is a plan view of an organic light emitting display apparatus according to an exemplary embodiment of the present disclosure. FIG. 2 is a cross-sectional view taken along the line II-II' of FIG. 1. All the components of the organic light emitting display apparatus according to all embodiments of the present disclosure are operatively coupled and configured.

With reference to FIGS. 1 and 2, an organic light emitting display apparatus 100 includes a substrate 110, a transistor 120, a color filter 130, an organic light emitting diode 140, and an encapsulation substrate 150.

The organic light emitting display apparatus 100 can be configured as a bottom emission type. For example, in the organic light emitting display apparatus 100 according to the exemplary embodiment of the present disclosure, light can be emitted to a rear surface of the substrate 110. According to the bottom emission type, light emitted from the organic light emitting diode 140 is emitted to a lower portion of the substrate 110 on which the organic light emitting diode 140 is formed. According to the bottom emission type, in order to allow light emitted from the organic light emitting diode 140 to travel to a lower portion of the substrate 110, a first electrode 141 can be formed of a transparent conductive material and a second electrode 143 can be formed of a metal material having a high reflectivity, which will be described below.

With reference to FIG. 1, the substrate 110 is a substrate which supports and protects several components of the organic light emitting display apparatus 100. The substrate 110 can be formed of a plastic material having flexibility. Further, since the organic light emitting display apparatus 100 is a bottom emission type, in order to allow the light to travel to a lower portion of the substrate 110, the substrate 110 can be formed of an insulating material having a transparency. For example, the substrate 110 can be formed of transparent polyimide (PI).

The substrate 110 includes a display area AA and a non-display area NA.

The display area AA is disposed at a center portion of the substrate 110 and images are displayed in the display area of the organic light emitting display apparatus 100. In the display area AA, a display element and various driving elements for driving the display element can be disposed. For example, the display element can be configured by an organic light emitting diode 140 including a first electrode 141, a light emitting portion 142, and a second electrode 143. Further, various driving elements for driving the display element, such as transistors, capacitors, or wiring lines can be disposed in the display area AA.

A plurality of pixels PX can be included in the display area AA. The plurality of pixels PX can be intersections of a plurality of gate lines disposed in a first direction and a plurality of data lines disposed in a second direction which is different from the first direction. Here, the first direction can be a horizontal direction of FIG. 1 and the second direction can be a vertical direction of FIG. 1, but are not limited thereto. The plurality of pixels PX can include a plurality of first pixels PX1, a plurality of second pixels PX2, a plurality of third pixels PX3, and a plurality of fourth pixels PX4 which emit light having different wavelengths. For example, the plurality of first pixels PX1 can be white pixels, the plurality of second pixels PX2 can be red pixels, the plurality of third pixels PX3 can be green pixels, and the plurality of fourth pixels PX4 can be blue pixels.

The pixel PX is a minimum unit which configures a screen and each of the plurality of pixels PX can include an organic light emitting diode 140 and a driving element. The driving element can include a switching transistor and a driving transistor. The driving element can be electrically connected to signal lines such as a gate line and a data line which are connected to a gate driver and a data driver disposed in the non-display area NA.

The non-display area NA is disposed in a peripheral area of the substrate 110 and the non-display area, images are not displayed. The non-display area NA is disposed so as to enclose the display area AA. Various components for driving a plurality of pixels PX disposed in the display area AA can be disposed in the non-display area NA. For example, a driving IC, a driving circuit, a signal line, and a flexible film which supply a signal for driving the plurality of pixels PX can be disposed. The driving IC can include a gate driver and a data driver, etc. The driving IC and the driving circuit can be disposed in a gate in panel (GIP) manner, a chip on film (COF) manner, a tape automated bonding (TAB) manner, a tape carrier package (TCP) manner, or a chip on glass (COG) manner, etc.

Hereinafter, one pixel PX disposed in the display area AA of the organic light emitting display apparatus 100 will be described in more detail with reference to FIG. 2. A cross-sectional view illustrated in FIG. 2 can be a cross-sectional view of a second pixel PX2. However, the structure of FIG. 2 can be applied not only to the second pixel PX2, but also to a third pixel PX3 and a fourth pixel PX4 in the same manner. Further, the same structure as in FIG. 2 can also be applied to the first pixel PX1 except that a color filter 130 is not disposed.

With reference to FIG. 2, a buffer layer 111 is disposed on the substrate 110. The buffer layer 111 can enhance adhesiveness between layers on the buffer layer 111 and the substrate 110. Further, the buffer layer 111 can block alkali components discharged from the substrate 110 and suppress diffusion of moisture and/or oxygen which penetrates from the outside of the substrate 110. The buffer layer 111 can be configured by a single layer or a multi-layer of silicon nitride (SiNx) or silicon oxide (SiOx) but is not limited thereto. Further, the buffer layer 111 can be omitted based on a type and a material of the substrate 110, and a structure and a type of the transistor 120.

The transistor 120 is disposed on the buffer layer 111 to drive the organic light emitting diode 140. The transistor 120 can be disposed in each of the plurality of pixels of the display area AA. The transistor 120 disposed in each of the plurality of pixels can be used as a driving element of the organic light emitting display apparatus 100. For example, the transistor 120 can be a thin film transistor (TFT), an N-channel metal oxide semiconductor (NMOS) transistor, a P-channel metal oxide semiconductor (PMOS) transistor, a complementary metal oxide semiconductor (CMOS) transistor, or a field effect transistor FET, but is not limited thereto. Hereinafter, the transistor 120 is assumed as a thin film transistor, but is not limited thereto.

The transistor 120 includes an active layer 121, a gate electrode 122, a source electrode 123, and a drain electrode 124. The transistor 120 illustrated in FIG. 2 is a top gate type thin film transistor in which the gate electrode 122 is disposed on the active layer 121. However, it is not limited thereto and the transistor 120 can be implemented as a bottom gate type thin film transistor.

The active layer 121 of the transistor 120 is disposed on the buffer layer 111. When the transistor 120 is driven, a channel is formed in the active layer 121. The active layer 121 can be formed of an oxide semiconductor or amorphous silicon (a-Si), polycrystalline silicon (poly-Si), or an organic semiconductor, but is not limited thereto.

Agate insulating layer 112 is disposed on the active layer 121. The gate insulating layer 112 can be formed as a single layer or a multi-layer of silicon nitride SiNx or silicon oxide SiOx, which is an inorganic material. In the gate insulating layer 112, a contact hole through which the source electrode 123 and the drain electrode 124 are in contact with a source area and a drain area of the active layer 121, respectively, is formed. The gate insulating layer 112 can be formed on the entire surface of the substrate 110 as illustrated in FIG. 2, or patterned to have the same width as the gate electrode 122, but is not limited thereto.

The gate electrode 122 is disposed on the gate insulating layer 112. The gate electrode 122 is disposed on the gate insulating layer 112 so as to overlap a channel area of the active layer 121. The gate electrode 122 can be formed of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

An interlayer insulating layer 113 is disposed on the gate electrode 122. The interlayer insulating layer 113 can be formed as a single layer or a multi-layer of silicon nitride SiNx or silicon oxide SiOx which is an inorganic material. In the interlayer insulating layer 113, a contact hole through which the source electrode 123 and the drain electrode 124 are in contact with the source area and the drain area of the active layer 121, respectively, is formed.

The source electrode 123 and the drain electrode 124 are disposed on the interlayer insulating layer 113. The source electrode 123 and the drain electrode 124 are electrically connected to the active layer 121 through the contact holes formed in the gate insulating layer 112 and the interlayer insulating layer 113. The source electrode 123 and the drain electrode 124 can be formed of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof. However, the present disclosure is not limited thereto.

For the convenience of description, in FIG. 2, only a driving transistor among various transistors 120 included in the display apparatus 100 is illustrated, but other transistors such as a switching transistor can also be disposed.

With reference to FIG. 2, a passivation layer 114 for protecting the transistor 120 is disposed on the transistor 120. A contact hole which exposes the drain electrode 124 of the transistor 120 is formed on the passivation layer 114. Even though in FIG. 2, the contact hole which exposes the drain electrode 124 is formed in the passivation layer 114, a contact hole which exposes the source electrode 123 can also be formed. The passivation layer 114 can be configured as a single layer or a multi-layer of silicon nitride SiNx or silicon oxide SiOx. However, the passivation layer 114 can be omitted depending on the exemplary embodiment of the present disclosure.

The color filter 130 is disposed on the passivation layer 114. The color filter 130 can be disposed so as to correspond to an emission area defined by a bank 116. The color filter 130 converts light emitted from the light emitting portion 142 of the organic light emitting diode 140 into light having a specific color. Since the second pixel PX2 illustrated in FIG. 2 is a red pixel, the color filter 130 can be a red color filter. Further, the third pixel PX3 which is a green pixel includes a green color filter and the fourth pixel PX4 which is a blue pixel includes a blue color filter. White light emitted from the light emitting portion 142 is converted into red light, green light, and blue light by the color filter 130 of the corresponding pixel PX. In the meantime, the color filter 130 may not be disposed in the first pixel PX1 which is a white pixel.

An over coating layer 115 is disposed on the passivation layer 114 and the color filter 130 to planarize an upper portion of the transistor 120. A contact hole which exposes the drain electrode 124 of the transistor 120 is formed on the over coating layer 115. Even though in FIG. 2, the contact hole which exposes the drain electrode 124 is formed in the over coating layer 115, a contact hole which exposes the source electrode 123 can also be formed. The over coating layer 115 can be formed of any one of acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto.

With reference to FIG. 2, the organic light emitting diode 140 is disposed on the over coating layer 115. The organic light emitting diode 140 includes a first electrode 141 which is formed on the over coating layer 115 to be electrically connected to the drain electrode 124 of the transistor 120, a light emitting portion 142 disposed on the first electrode 141, and a second electrode 143 formed on the light emitting portion 142. Here, the first electrode 141 can be an anode electrode and the second electrode 143 can be a cathode electrode.

The first electrode 141 is disposed on the over coating layer 115 to be electrically connected to the drain electrode 124 through contact holes formed in the passivation layer 114 and the over coating layer 115. The first electrode 141 can be formed of a transparent conductive material having a high work function to supply holes to the light emitting portion 142. For example, the first electrode 141 can be formed of transparent conductive oxide such as indium tin oxide (ITO), indium zinc oxide (IZO), indium tin zinc oxide (ITZO), zinc oxide (ZnO), and tin oxide (TO), but is not limited thereto.

Even though in FIG. 2, it is illustrated that the first electrode 141 is electrically connected to the drain electrode 124 of the transistor 120 through a contact hole, the first electrode 141 can also be configured to be electrically connected to the source electrode 123 of the transistor 120 through a contact hole by the type of the transistor 120 and a design method of the driving circuit.

The bank 116 is disposed on the first electrode 141 and the over coating layer 115. The bank 116 can cover an edge or periphery of the first electrode 141 of the organic light emitting diode 140 to define an emission area. The bank 116 is disposed at the boundary between the adjacent pixels to reduce the color mixture of light emitted from the organic light emitting diode 140 of each of the plurality of pixels. The bank 116 can be formed of an organic material. For example, the bank 116 can be formed of polyimide resin, acrylic resin, or benzocyclobutene resin, but is not limited thereto.

The light emitting portion 142 is disposed on the first electrode 141. The light emitting portion 142 can be a white light emitting layer which emits white light. The white light emitted from the light emitting portion 142 can be converted into any one of red, green, and blue by the color filter 130. Further, the light emitting portion 142 can further include various layers such as a hole transport layer, a hole injection layer, a hole blocking layer, an electron injection layer, an electron blocking layer, or an electron transport layer, etc. This will be described below with reference to FIG. 3.

The second electrode 143 is disposed on the light emitting portion 142. The second electrode 143 supplies electrons to the light emitting portion 142. The second electrode 143 can be formed of a conductive material having a low work function. For example, the second electrode 143 can be formed of any one or more among opaque conductive metals such as magnesium (Mg), silver (Ag), aluminum (Al), or calcium (Ca) or an alloy thereof, but is not limited thereto.

With reference to FIG. 2, an encapsulation layer 117 is disposed on the organic light emitting diode 140. The encapsulation layer 117 can cover the organic light emitting diode 140. The encapsulation layer 117 can protect the organic light emitting diode 140 from moisture, oxygen, and impacts of the outside. The encapsulation layer 117 can be formed by alternately laminating a plurality of inorganic layers and a plurality of organic layers. For example, the inorganic layer can be formed of an inorganic material such as silicon nitride SiNx, silicon oxide SiOx, and aluminum oxide AlOx and the organic layer can be formed of epoxy or acrylic polymer, but they are not limited thereto.

The encapsulation substrate 150 is disposed on the encapsulation layer 117. The encapsulation substrate 150 can protect the organic light emitting diode 140 from moisture, oxygen, and impacts of the outside, together with the encapsulation layer 117. The encapsulation substrate 150 can be formed of a metal material such as aluminum (Al), nickel (Ni), chrome (Cr), or an alloy material of iron (Fe) and nickel, but is not limited thereto.

With reference to FIG. 2, an adhesive member 118 is disposed between the encapsulation layer 117 and the encapsulation substrate 150. The adhesive member 118 can bond the encapsulation layer 117 and the encapsulation substrate 150 to each other. The adhesive member 118 is formed of a material having adhesiveness and can be a thermosetting or natural curable type adhesive. For example, the adhesive member 118 can be formed of an optical clear adhesive (OCA) or a pressure sensitive adhesive (PSA), but is not limited thereto.

Hereinafter, a structure of the organic light emitting diode 140 according to the exemplary embodiment of the present disclosure will be described in detail with reference to FIG. 3.

Figure 3:
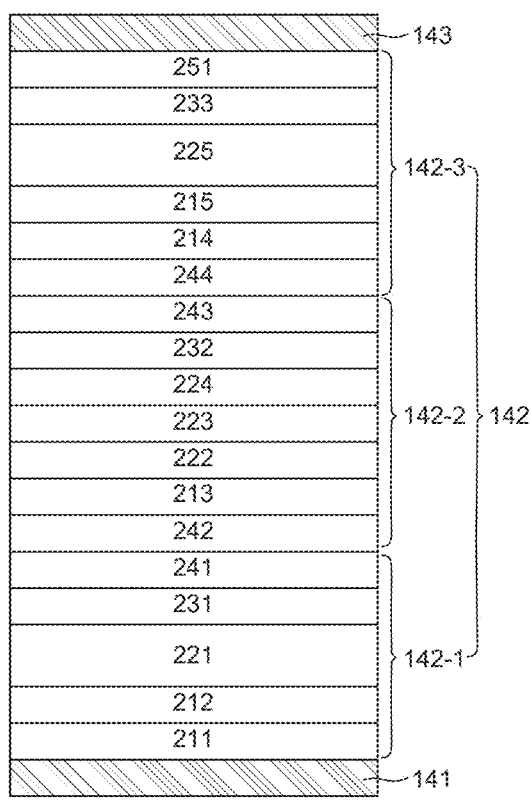
FIG. 3 is a view illustrating a structure of an organic light emitting diode of FIG. 2.

FIG. 3 is a view illustrating a structure of an organic light emitting diode of FIG. 2. A structure of the organic light emitting diode 140 of FIG. 3 can be applied to some or all of the plurality of pixels PX of the organic light emitting display apparatus 100.

With reference to FIG. 3, the organic light emitting diode 140 includes a first electrode 141, a light emitting portion 142, and a second electrode 143.

The light emitting portion 142 is disposed between the first electrode 141 and the second electrode 143. The light emitting portion 142 is an area where light is emitted by the coupling of electrons and holes supplied from the first electrode 141 and the second electrode 143. The light emitting portion 142 includes a first light emitting portion 142-1, a second light emitting portion 142-2, and a third light emitting portion 142-3.

The first light emitting portion 142-1 is disposed on the first electrode 141. The first light emitting portion 142-1 includes a first hole transport layer 211, a second hole transport layer 212, a first light emitting layer 221, a first electron transport layer 231, and a first N-type charge generating layer 241. Since the first light emitting layer 221 is a fluorescent emitting layer, the first light emitting portion 142-1 can be a fluorescent emitting portion. As another example, the first light emitting portion 142-1 may not include the first N-type charge generating layer 241.

The first hole transport layer 211 and the second hole transport layer 212 are sequentially disposed on the first electrode 141. For example, the first hole transport layer 211 and the second hole transport layer 212 are disposed on the first electrode 141. The first hole transport layer 211 and the second hole transport layer 212 are organic layers which smoothly transmit holes from the first electrode 141 to the first light emitting layer 221.

The first hole transport layer 211 can be configured by applying one or more layers or one or more materials. For example, the first hole transport layer 211 and the second hole transport layer 212 can be formed of a material including any one or more of NPD(N,N'-bis(naphthalen-1-yl)-N, N'-bis(phenyl)-2,2'-dimethylbenzidine), NPB(N,N'-bis (naphthalen-1-yl)-N,N'-bis(phenyl)-benzidine), TPD(N,N'-bis-(3-methylphenyl)-N,N'-bis-(phenyl)-benzidine), Spiro-TAD(2,2',7,7'-tetrakis(N,N-diphenylamino)-9,9'-spirofluorene), and MTDATA(4,4',4"-Tris(N-3-methylphenyl-N-phenyl-amino)-triphenylamine), but is not limited thereto.

A thickness of the first hole transport layer 211 can be 100 Å to 2200 Å. When the thickness of the first hole transport layer 211 is smaller than 100 Å, the first hole transport layer 211 may not smoothly transmit the holes to the first light emitting layer 221. When the thickness of the first hole transport layer 211 exceeds 2200 Å, the thickness of the organic light emitting display apparatus 100 can be excessively thick due to the thickness of the first hole transport layer 211.

The second hole transport layer 212 can serve as an electron blocking layer EBL. The electron blocking layer is an organic layer which blocks the electrons injected onto the first light emitting layer 221 from passing over the first hole transport layer 211 and the second hole transport layer 212. The electron blocking layer blocks the movement of the electrons to improve the coupling of the holes and electrons in the first light emitting layer 221 and improve an emission efficiency of the first light emitting layer 221. The electron blocking layer can be disposed on a different layer from the second hole transport layer 212. As another example, the second hole transport layer 212 can be omitted.

In the first light emitting layer 221, the holes supplied through the first electrode 141 and the electrons supplied through the second electrode 143 are recombined to generate excitons. Here, an area where the excitons are generated is referred to as an emission area (or emission zone) or a recombination zone.

The first light emitting layer 221 is disposed between the second hole transport layer 212 and the first electron transport layer 231. The first light emitting layer 221 which is a fluorescent emitting layer is disposed in the first light emitting portion 142-1 where excitons are formed and includes a material which emits specific color light. The first light emitting layer 221 can include a material which emits blue light.

The first light emitting layer 221 can have a host-dopant system. For example, the first light emitting layer 221 can have a system in which an emission dopant material having a smaller weight ratio is doped on a host material which occupies a larger weight ratio. The host of the first light emitting layer 221 can be configured by a single material or a mixed host formed of mixed materials. A blue fluorescent dopant material is doped on the first light emitting layer 221 including a single host material or a mixed host material. For example, the first light emitting layer 221 is a blue light emitting layer and a range of a wavelength of light emitted from the first light emitting layer 221 can be 440 nm to 480 nm.

The blue fluorescent dopant material is a material which is capable of emitting blue light. An EL spectrum of light emitted from the first light emitting layer 221 on which the blue fluorescent dopant material is doped can have a peak in a blue wavelength region, a peak in a dark blue wavelength region, or a peak in a sky blue wavelength region.

The host material of the first light emitting layer 221 can be formed by mixing one or more of $Alq_3$(tris(8-hydroxyquinolino)aluminum), ADN(9,10-di(naphth-2-yl)anthracene), and BSBF(2-(9,9-spirofluoren-2-yl)-9,9-spirofluorene), but is not limited thereto.

The blue fluorescent dopant material of the first light emitting layer 221 can be formed of a material having any one or more of a pyrene series material in which an aryl amine-based compound is substituted, an iridium (Ir) ligand complex including FIrPic(bis(3,5-difluoro-2-(2-pyridyl)phenyl-(2-carboxyprdidyl)iridium) or $Ir(ppy)_3$(factris(2-phenylpyridine)iridium)(tris(2-phenylpyridine)iridium), spiro-DPVBi, spiro-6P, spiro-BDAVBi(2,7-bis[4-(diphenylamino)styryl]-9,9'-spirofluorene), distyryl benzene (DSB), distyryl arylene (DSA), PFO-based polymer, and PPV-based polymer, but is not limited thereto.

The first electron transport layer 231 is disposed on the first light emitting layer 221. The first electron transport layer 231 is supplied with electrons from the first N-type charge generating layer 241. The first electron transport layer 231 can transmit the supplied electrons to the first light emitting layer 221.

The first electron transport layer 231 can serve as a hole blocking layer HBL. The hole blocking layer can suppress the holes which do not participate in the recombination from being leaked from the first light emitting layer 221.

The first electron transport layer 231 can be formed of any one or more of PBD(2-(4-biphenyl)-5-(4-tert-butylphenyl)-1,3,4-oxadiazole), TAZ(3-(4-biphenyl)-4-phenyl-5-tert-butylphenyl-1,2,4-triazole), BAlq(Bis(2-methyl-8-quinolinolate)-4-(phenylphenolato)aluminium), Liq(8-hydroxyquinolinolato-lithium), TPBi(2,2',2"-(1,3,5-benzinetriyl)-tris(1-phenyl-1-H-benzimidazole), Liq(8-hydroxyquinolinolato-lithium), and BCP(2,9-Dimethyl-4,7-diphenyl-1,10-phenanthroline), but is not limited thereto.

The first N-type charge generating layer 241 is disposed on the first electron transport layer 231. The first N-type charge generating layer 241 injects electrons into the first light emitting portion 142-1. The first N-type charge generating layer 241 is disposed between the first light emitting portion 142-1 and the second light emitting portion 142-2 adjacent to the first light emitting portion 142-1 to supply charges to the first light emitting portion 142-1.

The first N-type charge generating layer 241 can include an N-type dopant material and an N-type host material. The N-type dopant material can be a metal of Group 1 and Group 2 on the periodic table, an organic material which can inject the electrons, or a mixture thereof. For example, the N-type dopant material can be any one of an alkali metal and an alkaline earth metal. For example, the first N-type charge generating layer 241 can be formed of an organic layer doped with an alkali metal such as lithium (Li), sodium (Na), potassium (K), or cesium (Cs) or an alkali earth metal such as magnesium (Mg), strontium (Sr), barium (Ba), or radium (Ra), but is not limited thereto. The N-type host material can be formed of a material which is capable of transmitting electrons, for example, can be formed of any one or more of $Alq_3$(tris(8-hydroxyquinolino)aluminum), Liq(8-hydroxyquinolinolato-lithium), PBD(2-(4-biphenylyl)-5-(4-tert-butylphenyl)-1,3,4oxadiazole), TAZ(3-(4-biphenyl)4-phenyl-5-tert-butylphenyl-1,2,4-triazole), spiro-PBD, and BAlq (bis(2-methyl-8-quinolinolate)-4-(phenylphenolato) aluminium), SAlq, TPBi(2,2',2"-(1,3,5-benzinetriyl)-tris(1-phenyl-1-H-benzimidazole), oxadiazole, triazole, phenanthroline, benzoxazole, and benzthiazole, but is not limited thereto.

A thickness of the first light emitting portion 142-1 from which the first hole transport layer 211 is excluded can be 300 Å to 900 Å. Since the thickness of the first hole transport layer 211 is 100 Å to 2200 Å, a total thickness of the first light emitting portion 142-1 can be 400 Å to 3100 Å. Further, a distance between a center of the first light emitting layer 221 and a first surface of the second electrode 143 can be 2500 Å to 3100 Å.

The second light emitting portion 142-2 is disposed on the first light emitting portion 142-1. The second light emitting portion 142-2 includes a first P-type charge generating layer 242, a third hole transport layer 213, a second light emitting layer 222, a third light emitting layer 223, a fourth light emitting layer 224, a second electron transport layer 232, and a second N-type charge generating layer 243. Since the second light emitting layer 222, the third light emitting layer 223, and the fourth light emitting layer 224 are phosphorescent emitting layers, the second light emitting portion 142-2 can be a phosphorescent emitting portion. As another example, the second light emitting portion 142-2 may not include the first P-type charge generating layer 242 and the second N-type charge generating layer 243.

The first P-type charge generating layer 242 is disposed on the first N-type charge generating layer 241. The first P-type charge generating layer 242 injects holes into the second light emitting portion 142-2. The first P-type charge generating layer 242 is disposed between the first light emitting portion 142-1 and the second light emitting portion 142-2 which are adjacent to each other to supply charges to the second light emitting portion 142-2.

The first P-type charge generating layer 242 can include a P-type dopant material and a P-type host material. The P-type dopant material can be formed of metal oxide, an organic material such as tetrafluoro-tetracyanoquinodimethane (F4-TCNQ), HAT-CN (Hexaazatriphenylene-hexacarbonitrile), or hexaazatriphenylene, or a metal material such as $V_2O_5$, MoOx, and $WO_3$, but is not limited thereto. The P-type host material can be formed of a material which is capable of transmitting holes, for example, can be formed of a material including any one or more of NPD(N,N-dinaphthyl-N,N'-diphenyl benzidine)(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), and MTDATA(4,4',4"-Tris(N-3-methylphenyl-N-phenyl-amino)-triphenylamine), but is not limited thereto.

The third hole transport layer 213 is disposed on the first P-type charge generating layer 242. The third hole transport layer 213 is an organic layer which smoothly transmits holes from the first P-type charge generating layer 242 to the second light emitting layer 222, the third light emitting layer 223, and the fourth light emitting layer 224. The third hole transport layer 213 is substantially the same as the first hole transport layer 211 and the second hole transport layer 212 of the first light emitting portion 142-1, so that a redundant description will be omitted.

The second light emitting layer 222, the third light emitting layer 223, and the fourth light emitting layer 224 are sequentially disposed between the third hole transport layer 213 and the second electron transport layer 232. For example, the second light emitting layer 222, the third light emitting layer 223, and the fourth light emitting layer 224 are disposed between the third hole transport layer 213 and the second electron transport layer 232. The second light emitting layer 222, the third light emitting layer 223, and the fourth light emitting layer 224 which are phosphorescent emitting layers are disposed in the second light emitting portion 142-2 where excitons are formed and include a material which emits specific color light. The second light emitting layer 222 includes a material which emits red light and the third light emitting layer 223 and the fourth light emitting layer 224 include a material which emits yellow-green light. The fourth light emitting layer 224 can be omitted. For example, the fourth light emitting layer 224 can include a material which emits green light. For example, the second light emitting portion 142-2 can be configured by the second light emitting layer 222 and the third light emitting layer 223.

The second light emitting layer 222, the third light emitting layer 223, and the fourth light emitting layer 224 can have a host-dopant system, similar to the first light emitting layer 221. Each of the second light emitting layer 222, the third light emitting layer 223, and the fourth light emitting layer 224 can include a single host or a mixed host and at least one dopant. When the second light emitting layer 222, the third light emitting layer 223, and the fourth light emitting layer 224 include a mixed host, the mixed host can include a hole-type host and an electron-type host. When the second light emitting layer 222, the third light emitting layer 223, and the fourth light emitting layer 224 are configured by the mixed host or pre-mixed host, the host can be uniformly deposited in the light emitting layer so that the efficiency of the light emitting layer can be improved.

The second light emitting layer 222 which is a phosphorescent emitting layer can include a first hole-type host and a first electron-type host and the second light emitting layer 222 is doped with a red phosphorescent dopant material. For example, the second light emitting layer 222 is a red light emitting layer and a range of a wavelength of light emitted from the second light emitting layer 222 can be 600 nm to 650 nm.

The red phosphorescent dopant material is a material which is capable of emitting red light. An EL spectrum of light emitted from the second light emitting layer 222 doped with the red phosphorescent dopant material can have a peak in a red wavelength range.

The host material of the second light emitting layer 222 can be formed by mixing one or more of CBP(4,4'bis(carbozol-9-yl)biphenyl) and MCP(1,3-bis(carbazol-9-yl)benzene) but is not limited thereto.

The red phosphorescent dopant material of the second light emitting layer 222 can be formed of a material including any one or more of an iridium (Ir) ligand complex including Ir(ppy)$_3$(tris(2-phenylpyridine)iridium(III)), Ir(ppy)$_2$(acac)(Bis(2-phenylpyridine)(acetylacetonato) iridium(III)), PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium), Ir(piq)$_3$(tris(1-phenylisoquinoline)iridium), Ir(piq)$_2$(acac)(bis(1-phenylisoquinoline)(acetylacetonate)iridium), PtOEP(octaethylporphyrinporphine platinum) PBD:Eu (DBM)$_3$(Phen), and perylene, but is not limited thereto.

Each of the third light emitting layer 223 and the fourth light emitting layer 224 includes the same second hole-type host and second electron-type host. However, a ratio of the second hole-type host and the second electron-type host can be different in each light emitting layer.

For example, the third light emitting layer 223 is disposed to be closer to the first electrode 141 which supplies holes, than the fourth light emitting layer 224 and the fourth light emitting layer 224 is disposed to be closer to the second electrode 143 which supplies electrons, than the third light emitting layer 223. In the third light emitting layer 223, a ratio of the second electron-type host can be higher to be smoothly supplied with the electrons and in the fourth light emitting layer 224, a ratio of the second hole-type host can be higher to be smoothly supplied with the holes. Accordingly, the ratio of the second-hole type host and the second electron-type host can vary depending on a type of carrier which is relatively hard to reach each light emitting layer.

The third light emitting layer 223 and the fourth light emitting layer 224 are phosphorescent emitting layers and are doped with a yellow-green phosphorescent dopant material. For example, the third light emitting layer 223 and the fourth light emitting layer 224 can be yellow-green light emitting layers and a range of the wavelength of light emitted from the third light emitting layer 223 and the fourth light emitting layer 224 can be 510 nm to 590 nm.

The yellow-green phosphorescent dopant material is a material which is capable of emitting light having a wavelength of a yellow-green region. The EL spectrum of light emitted from the third light emitting layer 223 and the fourth light emitting layer 224 doped with the yellow-green dopant material has a peak in the yellow-green wavelength region or has a first peak in a yellow-green wavelength region and a second peak which is lower than the first peak in the red wavelength region. Alternatively, the EL spectrum can have a first peak in the yellow-green wavelength region and a point of inflection between the yellow-green wavelength region and the red wavelength region.

The host material of the third light emitting layer 223 and the fourth light emitting layer 224 can be formed by mixing one or more of CBP(4,4'bis(carbozol-9-yl)biphenyl) and MCP(1,3-bis(carbazol-9-yl)benzene) but is not limited thereto.

A yellow-green dopant material of the third light emitting layer 223 and the fourth light emitting layer 224 can be formed of a material including any one or more selected from a group consisting of an iridium (Ir) ligand complex including Ir(ppy)$_3$(tris(2-phenylpyridine)iridium(III)) or Ir(ppy)$_2$(acac)(Bis(2-phenylpyridine)(acetylacetonato) iridium(III)) or Alq$_3$(tris(8-hydroxyquinolino)aluminum), but is not limited thereto.

A range of the wavelength of the second light emitting portion 142-2 including the second light emitting layer 222, the third light emitting layer 223, and the fourth light emitting layer 224 can be 510 nm to 650 nm. For example, a range of the wavelength of the second light emitting layer 222 which is a red light emitting layer is 600 nm to 650 nm. Further, when the yellow-green dopant material has a peak in the yellow-green wavelength region, the range of the wavelength of the third light emitting layer 223 and the fourth light emitting layer 224, which are the yellow-green light emitting layers, can be 510 nm to 590 nm. Therefore, the range of the wavelength of the second light emitting portion 142-2 can be a minimum of 510 nm to a maximum of 650 nm.

The second electron transport layer 232 is disposed on the fourth light emitting layer 224. The second electron transport layer 232 is supplied with electrons from the second N-type charge generating layer 243. The second electron transport layer 232 transmits the supplied electrons to the second light emitting layer 222, the third light emitting layer 223, and the fourth light emitting layer 224. The second electron transport layer 232 is substantially the same as the first electron transport layer 231 of the first light emitting portion 142-1, so that a redundant description will be omitted.

The second N-type charge generating layer 243 is disposed on the second electron transport layer 232. The second N-type charge generating layer 243 injects electrons into the second light emitting portion 142-2. The second N-type charge generating layer 243 is disposed between the second light emitting portion 142-2 and the third light emitting portion 142-3 which are adjacent to each other to supply charges to the second light emitting portion 142-2. The second N-type charge generating layer 243 is substantially the same as the first N-type charge generating layer 241 of the first light emitting portion 142-1, so that a redundant description will be omitted.

A total thickness of the second light emitting portion 142-2 can be 750 Å to 1350 Å. Further, a distance between a center of the second light emitting layer 222 and the first surface of the second electrode 143 can be 2000 Å to 2600 Å. A distance between a boundary of the third light emitting layer 223 and the fourth light emitting layer 224 which is the center of the third light emitting layer 223 and the fourth light emitting layer 224 and the first surface of the second electrode 143 can be 1700 Å to 2300 Å.

The third light emitting portion 142-3 is disposed on the second light emitting portion 142-2. The third light emitting portion 142-3 includes a second P-type charge generating layer 244, a fourth hole transport layer 214, a fifth hole transport layer 215, a fifth light emitting layer 225, a third electron transport layer 233, and an electron injection layer 251. Since the fifth light emitting layer 225 is a fluorescent emitting layer, the third light emitting portion 142-3 can be as a fluorescent emitting portion. As another example, the third light emitting portion 142-3 may not include the second P-type charge generating layer 244.

The second P-type charge generating layer 244 is disposed on the second N-type charge generating layer 243. The second P-type charge generating layer 244 injects holes into the third light emitting portion 142-3. The second P-type charge generating layer 244 is disposed between the second light emitting portion 142-2 and the third light emitting portion 142-3 which are adjacent to each other to supply charges to the third light emitting portion 142-3. The second P-type charge generating layer 244 is substantially the same as the first P-type charge generating layer 242 of the second light emitting portion 142-2, so that a redundant description will be omitted.

The fourth hole transport layer 214 and the fifth hole transport layer 215 are sequentially disposed on the second P-type charge generating layer 244. The fourth hole transport layer 214 and the fifth hole transport layer 215 are organic layers which smoothly transmit holes from the second P-type charge generating layer 244 to the fifth light emitting layer 225. The fourth hole transport layer 214 and the fifth hole transport layer 215 are substantially the same as the first hole transport layer 211 and the second hole transport layer 212 of the first light emitting portion 142-1, so that a redundant description will be omitted.

The fifth light emitting layer 225 is disposed between the fifth hole transport layer 215 and the third electron transport layer 233. The fifth light emitting layer 225 is disposed in the third light emitting portion 142-3 where excitons are formed and includes a material which emits specific color light. For example, the fifth light emitting layer 225 can include a material which emits blue light. The fifth light emitting layer 225 is substantially the same as the first light emitting layer 221 of the first light emitting portion 142-1, so that a redundant description will be omitted.

The third electron transport layer 233 is disposed on the fifth light emitting layer 225. The third electron transport layer 233 is supplied with electrons from the second electrode 143. The third electron transport layer 233 transmits the supplied electrons to the fifth light emitting layer 225. The third electron transport layer 233 is substantially the same as the first electron transport layer 231 of the first light emitting portion 142-1, so that a redundant description will be omitted.

The electron injection layer 251 is disposed on the third electron transport layer 233. The electron injection layer 251 is an organic layer which smoothly injects the electrons from the second electrode 143 to the fifth light emitting layer 225. The electron injection layer 251 can be formed of a material including any one or more of LIF, Al, $MoO_3$, LiQ(lithium quinolate), Alq3(tris(8-hydroxyquinolino)aluminum), PBD, TAZ, spiro-PBD, BAlq, or SAlq, but is not limited thereto. The electron injection layer 251 can be omitted.

A total thickness of the third light emitting portion 142-3 can be 1200 Å to 1800 Å. Further, a distance between a center of the fifth light emitting layer 225 and the first surface of the second electrode 143 can be 100 Å to 700 Å.

The organic light emitting diode 140 is an organic light emitting diode 140 having a three stack structure in which the first light emitting portion 142-1, the second light emitting portion 142-2, and the third light emitting portion 142-3 are laminated. Light which is finally emitted from the light emitting portion 142 can be implemented by mixing light emitted from the first light emitting portion 142-1, the second light emitting portion 142-2, and the third light emitting portion 142-3. Accordingly, a design in the light emitting portion 142 can vary depending on a color of light to be implemented. For example, the first light emitting portion 142-1 and the third light emitting portion 142-3 which are fluorescent emitting portions emit blue light and the second light emitting portion 142-2 which is a phosphorescent emitting portion emits red light and yellow-green light. Therefore, the organic light emitting diode 140 according to the exemplary embodiment of the present disclosure can be an organic light emitting diode 140 which emits white light.

Figure 4:
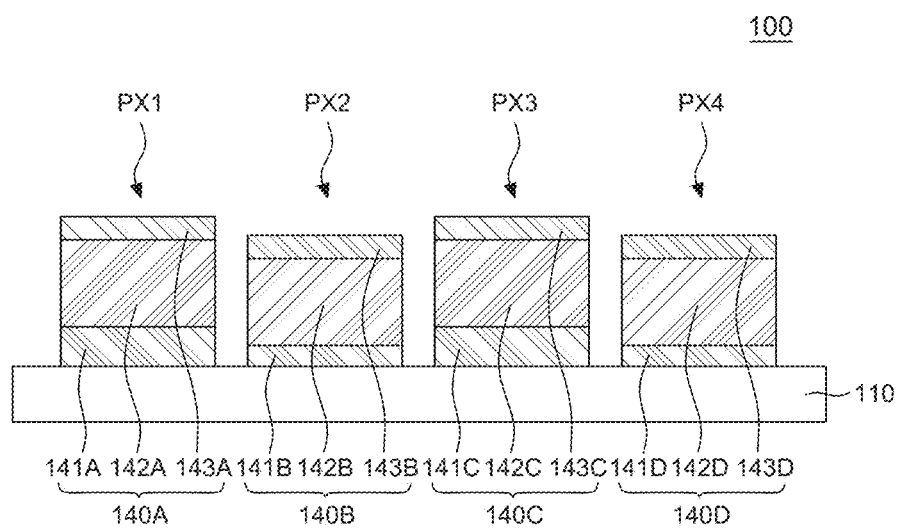
FIG. 4 is a cross-sectional view of an organic light emitting display apparatus according to an exemplary embodiment of the present disclosure.

FIG. 4 is a schematic cross-sectional view of an organic light emitting display apparatus according to an exemplary embodiment of the present disclosure. In FIG. 4, for the convenience of description, only the substrate 110 and organic light emitting diodes 140A, 140B, 140C, and 140D disposed on the substrate 110 of the organic light emitting display apparatus 100 of FIG. 2 are illustrated. The configuration of the organic light emitting diodes 140A, 140B, 140C, and 140D can be the same as the organic light emitting diode 140 illustrated in FIG. 3.

With reference to FIG. 4, the organic light emitting display apparatus 100 according to the exemplary embodiment of the present disclosure includes a first organic light emitting diode 140A corresponding to the first pixel PX1, a second organic light emitting diode 140B corresponding to the second pixel PX2, a third organic light emitting diode 140C corresponding to the third pixel PX3, and a fourth organic light emitting diode 140D corresponding to the fourth pixel PX4. For example, the first pixel PX1 can be a white pixel, the second pixel PX2 can be a red pixel, the third pixel PX3 can be a green pixel, and the fourth pixel PX4 can be a blue pixel. Light emitted from the first organic light emitting diode 140A is white light, white light emitted from the second organic light emitting diode 140B can be converted into red light by the color filter 130. The white light emitted from the third organic light emitting diode 140C can be converted into green light by the color filter 130 and the white light emitted from the fourth organic light emitting diode 140D can be converted into blue light by the color filter 130.

The first organic light emitting diode 140A includes a first electrode 141A, a light emitting portion 142A, and a second electrode 143A. The second organic light emitting diode 140B includes a first electrode 141B, a light emitting portion 142B, and a second electrode 143B. The third organic light emitting diode 140C includes a first electrode 141C, a light emitting portion 142C, and a second electrode 143C. The fourth organic light emitting diode 140D includes a first electrode 141D, a light emitting portion 142D, and a second electrode 143D. The light emitting portions 142A, 142B, 142C, and 142D of the first organic light emitting diode 140A, the second organic light emitting diode 140B, the third organic light emitting diode 140C, and the fourth organic light emitting diode 140D can have the same configuration. Further, the second electrodes 143A, 143B, 143C, and 143D of the first organic light emitting diode 140A, the second organic light emitting diode 140B, the third organic light emitting diode 140C, and the fourth organic light emitting diode 140D can have the same configuration. For example, only the thicknesses of the first electrodes 141A, 141B, 141C, and 141D of the first organic light emitting diode 140A, the second organic light emitting diode 140B, the third organic light emitting diode 140C, and the fourth organic light emitting diode 140D can be different.

The first pixel PX1, the second pixel PX2, the third pixel PX3, and the fourth pixel PX4 can have a micro cavity structure corresponding to light emitted from the corresponding pixel PX. According to the micro cavity structure, light is repeatedly reflected between the first electrode 141 and the second electrode 143 which are spaced apart from each other with an optical length therebetween so that light of a specific wavelength is amplified by the constructive interference. Therefore, the second pixel PX2 can have a micro cavity structure in which light of a wavelength corresponding to red can be amplified. The third pixel PX3 can have a micro cavity structure in which light of a wavelength corresponding to green can be amplified. The fourth pixel PX4 can have a micro cavity structure in which light of a wavelength corresponding to blue can be amplified.

The micro cavity can be implemented by the thickness of the first electrode 141 which is a transparent conductive material and a refractive index difference between the first electrode 141 and the first hole transport layer 211. For example, when the first electrode 141 is formed of indium zinc oxide, the first electrode 141 has a larger refractive index so that a refractive index difference between the first electrode 141 and the first hole transport layer 211 can be increased. Therefore, more light can be reflected by the first electrode 141 so that the light can be more efficiently amplified. Further, in order to implement optimized micro cavity effect for each of the first pixel PX1, the second pixel PX2, the third pixel PX3, and the fourth pixel PX4, the thickness of the first electrode 141 for every pixel can be formed to be different.

To improve the color viewing angle characteristic, the thickness of the first electrode 141A of the first organic light emitting diode 140A can be configured to be different from the thickness of the first electrode 141B of the second organic light emitting diode 140B. For example, the same micro cavity structure may not be applied to the first pixel PX1 and the second pixel PX2. That is to say, different micro cavity structures may be applied to the first pixel PX1 and the second pixel PX2. For example, when the thickness of the first electrode 141A and the thickness of the first electrode 141B are equal to each other, the color of the first pixel PX1 can be changed according to a viewing angle. Therefore, the thickness of the first electrode 141A and the thickness of the first electrode 141B are set to be different from each other to minimize the color change according to the viewing angle of the organic light emitting display apparatus 100.

Here, the color viewing angle refers to a changing degree of white in accordance with the change of the viewing angle as compared with white on a front surface in a state in which a screen of the display apparatus is set to be white having a color temperature of 10,000 K. When the changing degree of white in accordance with the change of the viewing angle is small, the color viewing angle characteristic is good and when the changing degree of white in accordance with the change of the viewing angle is large, the color viewing angle characteristic is not good.

To improve the luminance viewing angle characteristic, the thickness of the first electrode 141B of the second organic light emitting diode 140B can be formed to be different from the thickness of the first electrode 141C of the third organic light emitting diode 140C. For example, the same micro cavity structure may not be applied to the second pixel PX2 and the third pixel PX3. That is to say, different micro cavity structures may be applied to the second pixel PX2 and the third pixel PX3. For example, when the thickness of the first electrode 141B and the thickness of the first electrode 141C are equal to each other, the luminance of the second pixel PX2 can be changed according to the viewing angle. Therefore, the thickness of the first electrode 141B and the thickness of the first electrode 141C are set to be different from each other to minimize the luminance change according to the viewing angle of the organic light emitting display apparatus 100.

Here, the luminance viewing angle refers to a reducing degree of the luminance according to the viewing angle. When the changing degree of luminance in accordance with the change of the viewing angle is small, the luminance viewing angle characteristic is good and when the changing degree of luminance in accordance with the change of the viewing angle is large, the luminance viewing angle characteristic is not good.

Hereinafter, a color change characteristic and a luminance change characteristic according to the viewing angle will be described with reference to FIGS. 5 and 6.

Figure 5:
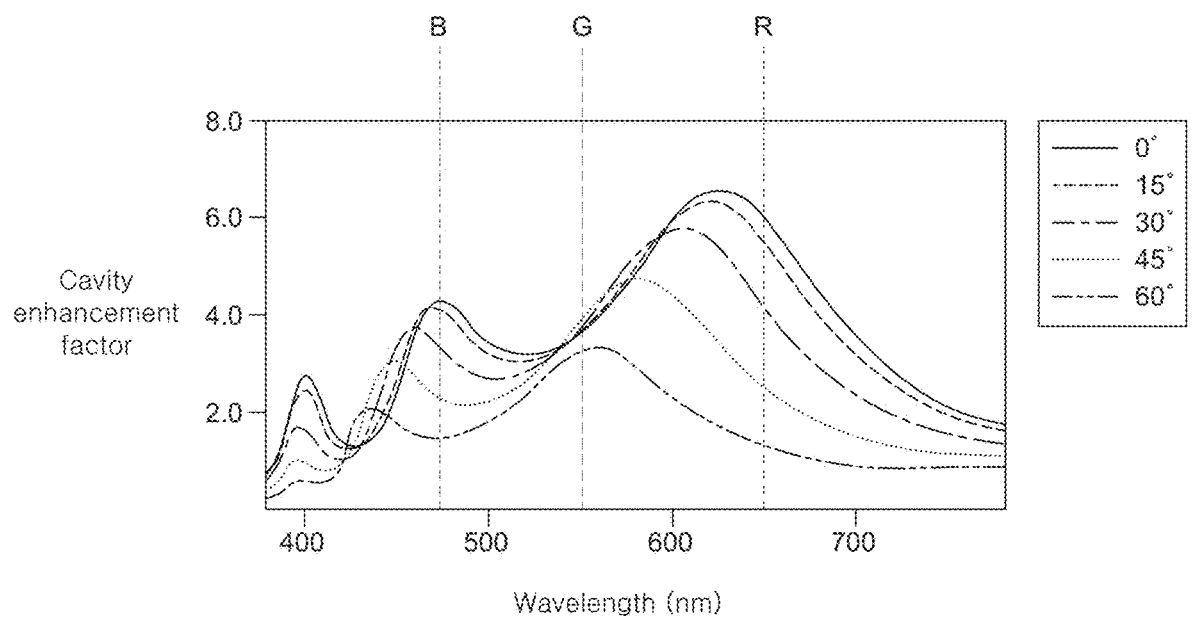
FIG. 5 is a graph illustrating a cavity enhancement factor according to a wavelength for every viewing angle.

FIG. 5 is a graph illustrating a cavity enhancement factor according to a wavelength for every viewing angle. In FIG. 5, a micro cavity structure of the second pixel PX2 is applied to the first pixel PX1. For example, FIG. 5 is a graph measured by applying a thickness of the first electrode 141A of the first pixel PX1 to be 400 Å and a thickness of the first hole transport layer 211 to be 500 Å. The graph of FIG. 5 was measured at viewing angles of 0°, 15°, 30°, 45°, and 60°.

A cavity enhancement factor represents a ratio of a power when exciton is in the organic light emitting diode 140 to a power (assumed to be 1) when exciton is in the air. The power when the exciton is in the air refers to a power when the micro cavity is not applied. For example, the cavity enhancement factor can refer to an amplification ratio of light by the micro cavity.

With reference to FIG. 5, it is confirmed that a peak of the cavity enhancement factor varies according to the viewing angle. For example, since the distance of the micro cavity varies in accordance with the viewing angle, the peak to be amplified can vary. It is confirmed that a peak at approximately 650 nm which is a red R region and a peak at approximately 470 nm which is a blue B region are sharply reduced as the viewing angle is increased. For example, the peak in the red R region can be shifted to the blue B region. However, it is confirmed that the cavity enhancement factor at approximately 550 nm which is a green G region is maintained at a constant level even though the viewing angle is increased. For example, the larger the viewing angle, the smaller the cavity enhancement factor of the red R region and the blue B region, but the cavity enhancement factor in the green G region is maintained. Accordingly, the amplification degree of light in the green G region is relatively increased so that the white light emitted from the first pixel PX1 can be greenish. In other words, the color of the white light of the first pixel PX1 varies according to the viewing angle, so that the color viewing angle characteristic can be degraded. As a result, when the thickness of the first electrode 141A of the first pixel PX1 and the thickness of the first electrode 141B of the second pixel PX2 are configured to be different, the color viewing angle characteristic can be improved.

Figure 6:
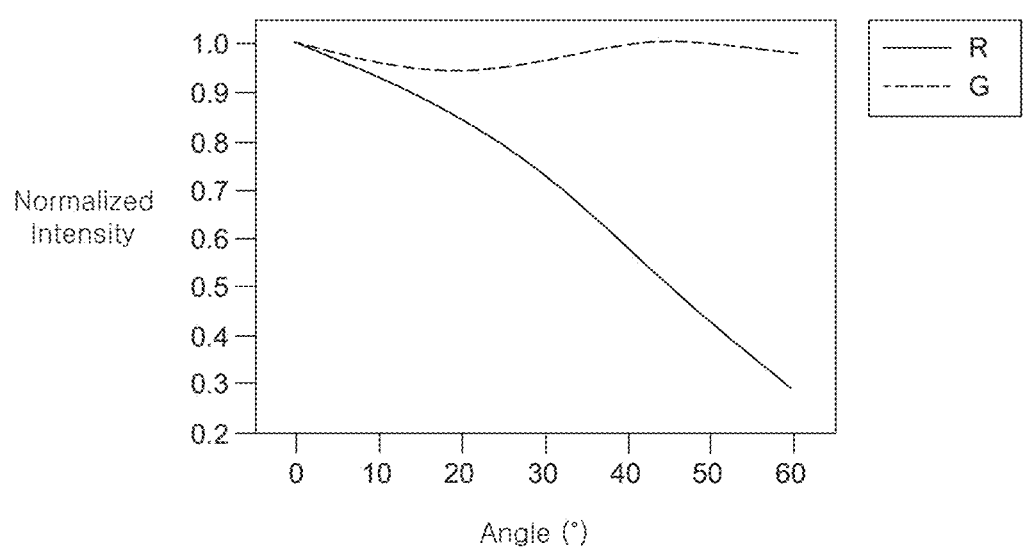
FIG. 6 is a graph illustrating a luminance according to a viewing angle.

FIG. 6 is a graph illustrating a luminance according to a viewing angle. FIG. 6 was measured under the same condition as FIG. 5. A normalized intensity of FIG. 6 can refer to a luminance.

With reference to FIG. 6, it is confirmed that as the viewing angle Angle is increased, the luminance of the red R light is reduced, but the luminance of the green G light is maintained at a constant level. For example, the larger the viewing angle, the larger the luminance of the green G light, relatively, so that the luminance deviation of the red R light and the green G light can be increased. Accordingly, as the viewing angle is increased, the white light can be green color. In other words, the luminance of the white light is changed in accordance with the viewing angle, so that the luminance viewing angle characteristic can be degraded. For example, the luminance deviation of the red R light and the green G light is increased according to the viewing angle, so that the thickness of the first electrode 141B of the second pixel PX2 and the thickness of the first electrode 141C of the third pixel PX3 can be configured to be different.

Hereinafter, a thickness of the first electrode will be described with reference to FIGS. 7 to 8D.

Figure 7:
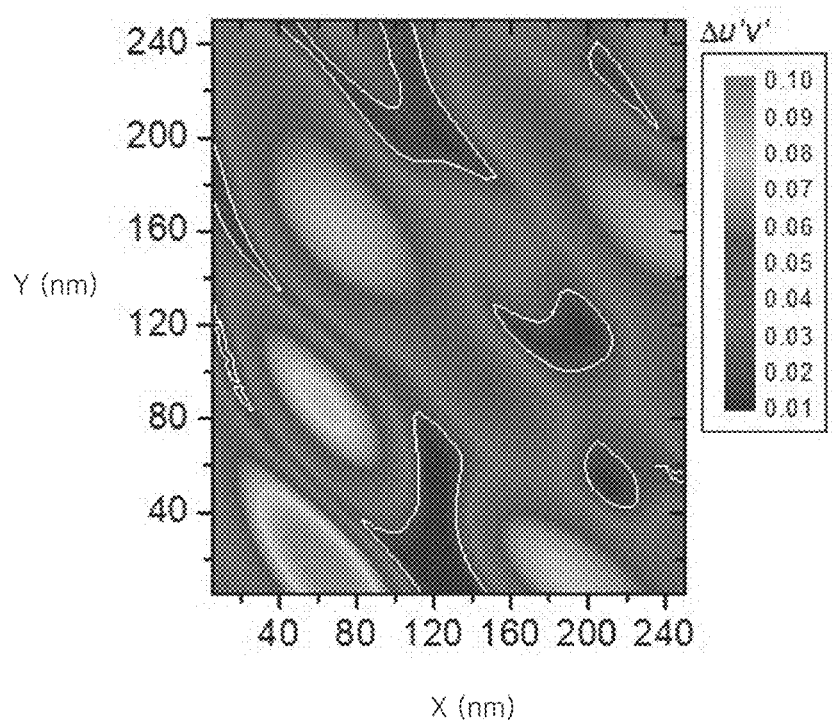
FIG. 7 illustrates a color viewing angle characteristic according to thicknesses of a first electrode of a first pixel and a first hole transport layer.

FIG. 7 illustrates a color viewing angle characteristic according to thicknesses of a first electrode and a first hole transport layer of a first pixel. FIGS. 8A to 8D illustrate a luminance characteristic according to thicknesses of first electrodes and first hole transport layers of a first pixel, a second pixel, a third pixel, and a fourth pixel. An X-axis of FIGS. 7 to 8D refers to a thickness of the first electrode and a Y-axis refers to a thickness of the first hole transport layer. The larger the value of Δu'v' of FIG. 7, the worse the color viewing angle characteristic. The larger the value of cdm$^{-2}$ of FIGS. 8A to 8D, the worse the luminance viewing angle characteristic.

Figure 8A:
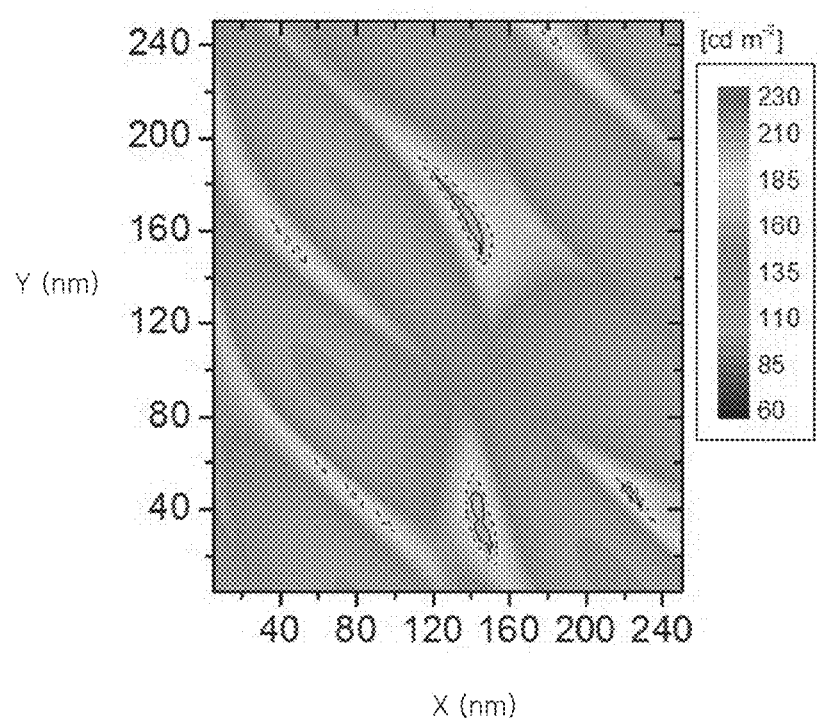
FIGS. 8A to 8D illustrate a luminance characteristic according to thicknesses of first electrodes and first hole transport layers of a first pixel, a second pixel, a third pixel, and a fourth pixel.

With reference to FIGS. 7 and 8A, it is confirmed that when the thickness range of the first hole transport layer 211 of the first pixel PX1 is 100 Å to 1000 Å, the first electrode 141A has excellent color viewing angle characteristic and luminance viewing angle characteristic in a thickness range of 200 Å to 1600 Å or 2000 Å to 2400 Å. Further, when the thickness range of the first hole transport layer 211 of the first pixel PX1 is 1000 Å to 2200 Å, the first electrode 141A can have excellent color viewing angle characteristic and luminance viewing angle characteristic in a thickness range of 100 Å to 600 Å or 1000 Å to 1800 Å.

Figure 8B:
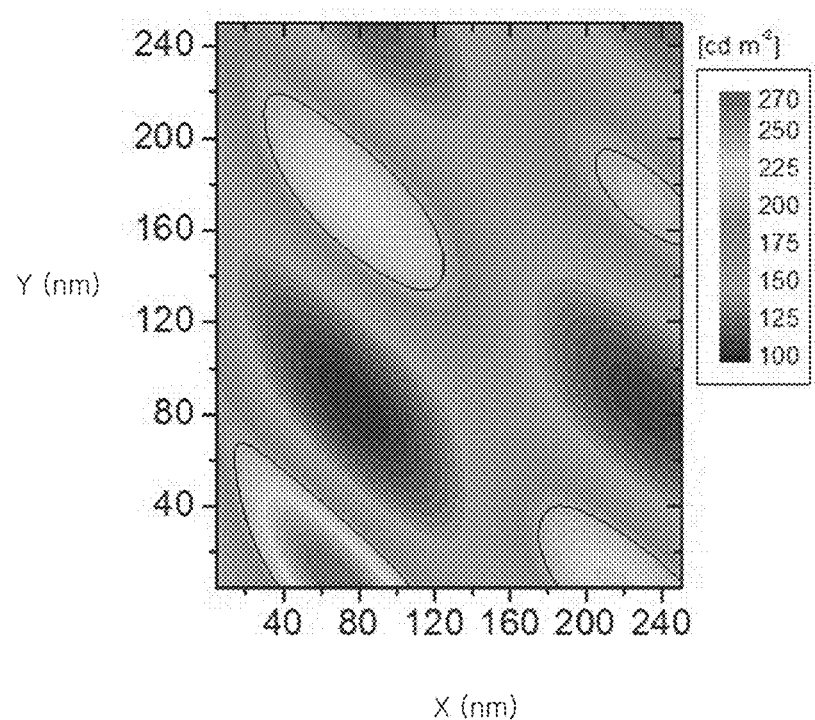

With reference to FIG. 8B, when a thickness range of the first hole transport layer 211 of the second pixel PX2 is 100 Å to 1000 Å, a thickness range of the first electrode 141B can be 200 Å to 1000 Å or 1700 Å to 2400 Å. When a thickness range of the first hole transport layer 211 of the second pixel PX2 is 1000 Å to 2200 Å, a thickness range of the first electrode 141B can be 200 Å to 1200 Å or 1600 Å to 2400 Å. The second pixel PX2 can have excellent luminance characteristic in the above-described range.

Figure 8C:
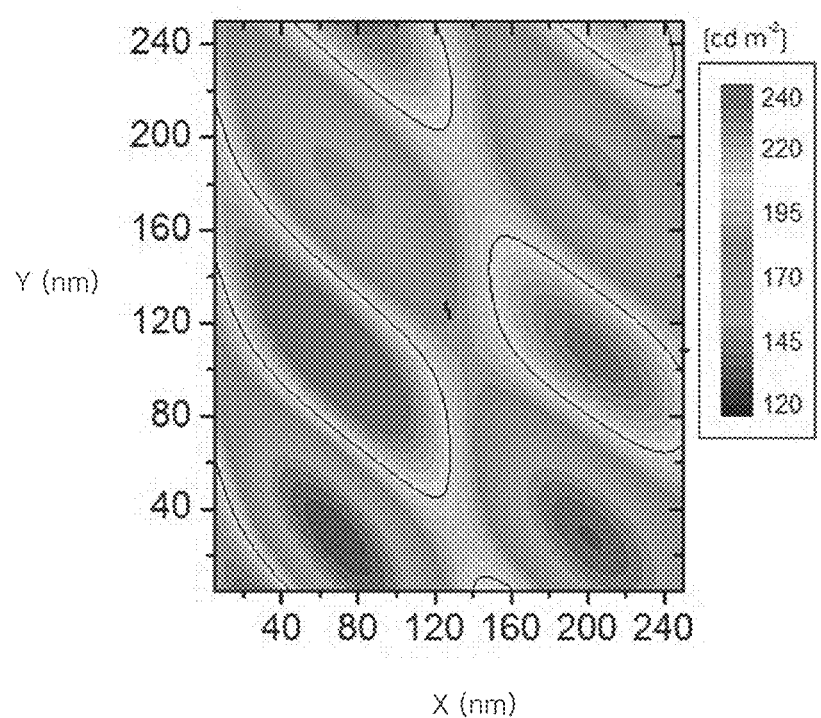

With reference to FIG. 8C, when a thickness range of the first hole transport layer 211 of the third pixel PX3 is 100 Å to 1000 Å, a thickness range of the first electrode 141C can be 800 Å to 1600 Å. When a thickness range of the first hole transport layer 211 of the third pixel PX3 is 1000 Å to 2200 Å, a thickness range of the first electrode 141C can be 100 Å to 600 Å or 1200 Å to 2200 Å. The third pixel PX3 can have excellent luminance characteristic in the above-described range.

Figure 8D:
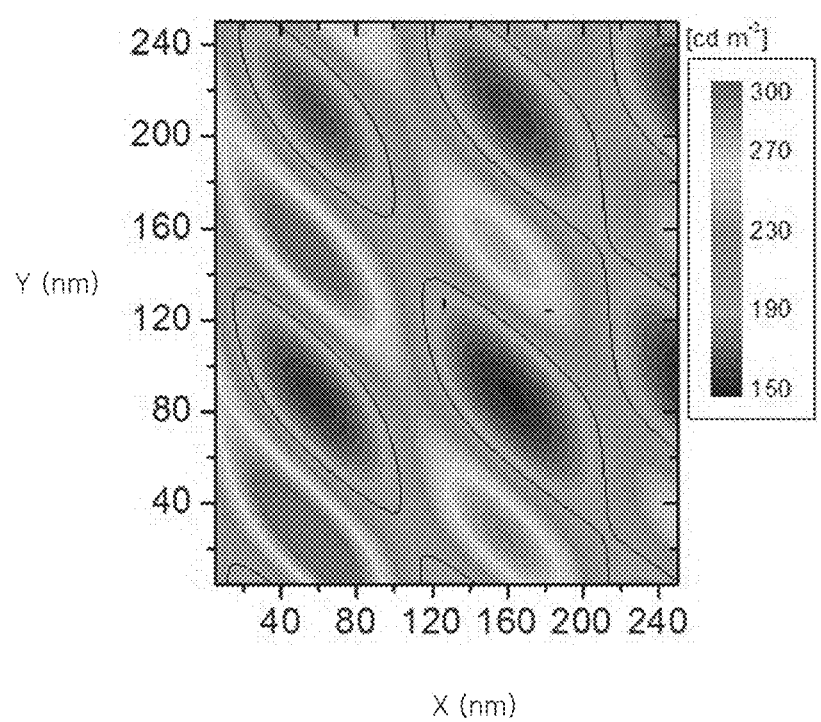

With reference to FIG. 8D, when a thickness range of the first hole transport layer 211 of the fourth pixel PX4 is 100 Å to 1000 Å, a thickness range of the first electrode 141D can be 200 Å to 1000 Å, or 1200 Å to 2000 Å, or 2200 Å to 2400 Å. When a thickness range of the first hole transport layer 211 of the fourth pixel PX4 is 1000 Å to 2200 Å, a thickness range of the first electrode 141D can be 100 Å to 600 Å or 1200 Å to 2000 Å. The fourth pixel PX4 can have excellent luminance characteristic in the above-described range.

The thicknesses of the first electrode 141A of the first pixel PX1, the first electrode 141B of the second pixel PX2, the first electrode 141C of the third pixel PX3, and the first electrode 141D of the fourth pixel PX4 can be set in the above-described range. The thickness of the first electrode 141A of the first organic light emitting diode 140A can be set to be different from the thickness of the first electrode 141B of the second organic light emitting diode 140B. The thickness of the first electrode 141B of the second organic light emitting diode 140B can be set to be different from the thickness of the first electrode 141C of the third organic light emitting diode 140C.

With reference to FIG. 4 again, the thickness of the first electrode 141A of the first pixel PX1 can be equal to the thickness of the first electrode 141C of the third pixel PX3. The thickness of the first electrode 141B of the second pixel PX2 can be equal to the thickness of the first electrode 141D of the fourth pixel PX4. For example, the first electrodes 141A, 141B, 141C, and 141D of the organic light emitting display apparatus 100 can be formed by performing a photo process two times. Therefore, the photo process for forming the first electrodes 141A, 141B, 141C, and 141D is minimized and the color change and the luminance change according to the viewing angle are also minimized.

In the meantime, even though in FIG. 4, it is illustrated that the thicknesses of the first electrode 141A of the first pixel PX1 and the first electrode 141C of the third pixel PX3 are larger than the thicknesses of the first electrode 141B of the second pixel PX2 and the first electrode 141D of the fourth pixel PX4, the present disclosure is not limited thereto. For example, the thicknesses of the first electrode 141A of the first pixel PX1 and the first electrode 141C of the third pixel PX3 can be smaller than the thicknesses of the first electrode 141B of the second pixel PX2 and the first electrode 141D of the fourth pixel PX4.

In the organic light emitting display apparatus, anodes of a white pixel, a red pixel, a green pixel, and a blue pixel which emit different color light are formed to have the same thickness. For example, the same micro cavity structure is applied to each pixel. In this case, color of light emitted from the white pixel is changed according to the viewing angle so that there is a problem in that the color viewing angle characteristic is degraded. Further, luminance of light emitted from the red pixel, the green pixel, or the blue pixel is changed according to the viewing angle so that there is a problem in that the luminance viewing angle characteristic is degraded.

The organic light emitting display apparatus 100 according to an exemplary embodiment of the present disclosure adjusts the thickness of the first electrode 141 of each of the first pixel PX1, the second pixel PX2, the third pixel PX3, and the fourth pixel PX4 which emit different color light. Therefore, the color viewing angle characteristic and the luminance viewing angle characteristic can be improved. For example, the thickness of the first electrode 141A of the first pixel PX1 which is a white pixel and the thickness of the first electrode 141B of the second pixel PX2 which is a red pixel are configured to be different, so that the color viewing angle characteristic can be improved. Further, the thickness of the first electrode 141B of the second pixel PX2 which is a red pixel and the thickness of the first electrode 141C of the third pixel PX3 which is a green pixel are configured to be different, so that the luminance viewing angle characteristic can be improved.

Further, the thicknesses of the first electrode 141A of the first pixel PX1 and the first electrode 141C of the third pixel PX3 can be configured to be equal to each other and the thicknesses of the first electrode 141B of the second pixel PX2 and the first electrode 141D of the fourth pixel PX4 can be configured to be equal to each other. Accordingly, the first electrode 141A of the first pixel PX1 and the first electrode 141C of the third pixel PX3 can be simultaneously formed and the first electrode 141B of the second pixel PX2 and the first electrode 141D of the fourth pixel PX4 can be simultaneously formed. For example, the first electrodes 141 of the organic light emitting display apparatus 100 can be formed by performing the photo process two times. Accordingly, the photo process can be minimized and a micro cavity structure optimized for every pixel PX1, PX2, PX3, PX4 can also be applied.

Figure 9:
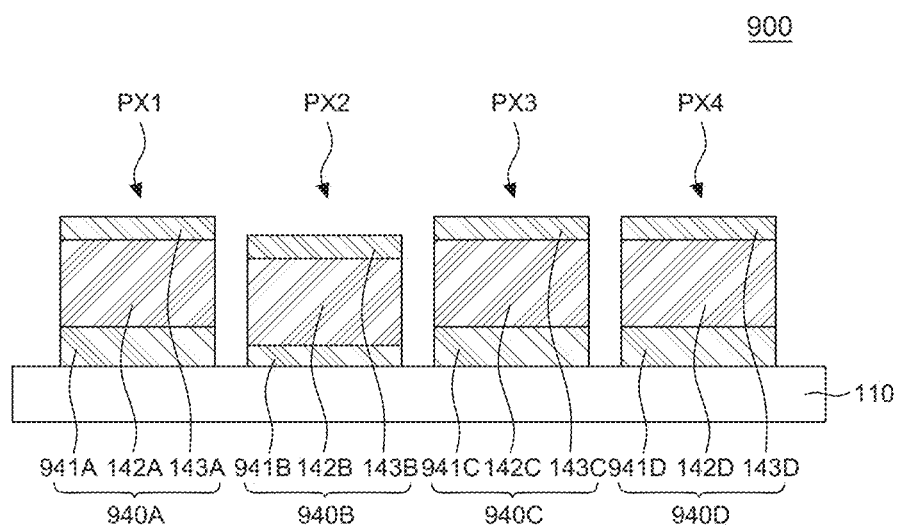
FIGS. 9 to 14 are schematic cross-sectional views of an organic light emitting display apparatus according to various exemplary embodiments of the present disclosure.

FIG. 9 is a schematic cross-sectional view of an organic light emitting display apparatus according to another exemplary embodiment of the present disclosure. An organic light emitting display apparatus 900 of FIG. 9 is substantially the same as the organic light emitting display apparatus 100 of FIG. 4 except for a thickness relationship of a first electrode 941A of a first pixel PX1, a first electrode 941B of a second pixel PX2, a first electrode 941C of a third pixel PX3, and a first electrode 941D of a fourth pixel PX4 so that a redundant description will be omitted.

With reference to FIG. 9, the organic light emitting display apparatus 900 includes a first organic light emitting diode 940A corresponding to the first pixel PX1, a second organic light emitting diode 940B corresponding to the second pixel PX2, a third organic light emitting diode 940C corresponding to the third pixel PX3, and a fourth organic light emitting diode 940D corresponding to the fourth pixel PX4. For example, the first pixel PX1 can be a white pixel, the second pixel PX2 can be a red pixel, the third pixel PX3 can be a green pixel, and the fourth pixel PX4 can be a blue pixel. For example, light emitted from the first organic light emitting diode 940A is white light, white light emitted from the second organic light emitting diode 940B can be converted into red light by the color filter 130. The white light emitted from the third organic light emitting diode 940C can be converted into green light by the color filter 130 and the white light emitted from the fourth organic light emitting diode 940D can be converted into blue light by the color filter 130.

A thickness of the first electrode 941A of the first pixel PX1 can be different from a thickness of the first electrode 941B of the second pixel PX2. The thickness of the first electrode 941A of the first pixel PX1, a thickness of the first electrode 941C of the third pixel PX3, and a thickness of the first electrode 941D of the fourth pixel PX4 can be equal to one another. For example, the thickness of the first electrode 941A of the first pixel PX1 and the thickness of the first electrode 941B of the second pixel PX2 are configured to be different, so that the color viewing angle characteristic of the organic light emitting display apparatus 900 can be improved. Further, the thickness of the first electrode 941B of the second pixel PX2 and the thickness of the first electrode 941C of the third pixel PX3 are configured to be different, so that the luminance viewing angle characteristic of the organic light emitting display apparatus 900 can be improved.

Here, when the thickness of the first hole transport layer 211 is 100 Å to 1000 Å, the thickness of the first electrode 941A is 200 Å to 1600 Å or 2000 Å to 2400 Å. Further, the thickness of the first electrode 941B is 200 Å to 1000 Å or 1700 Å to 2400 Å, the thickness of the first electrode 941C is 800 Å to 1600 Å, and the thickness of the first electrode 941D is 200 Å to 1000 Å or 1200 Å to 2000 Å, or 2200 Å to 2400 Å. When the thickness of the first hole transport layer 211 is 1000 Å to 2200 Å, the thickness of the first electrode 941A is 100 Å to 600 Å or 1000 Å to 1800 Å. Further, the thickness of the first electrode 941B is 200 Å to 1200 Å or 1600 Å to 2400 Å, the thickness of the first electrode 941C is 100 Å to 600 Å or 1200 Å to 2200 Å, and the thickness of the first electrode 941D is 100 Å to 600 Å or 1200 Å to 2000 Å.

Even though in FIG. 9, it is illustrated that the thickness of the first electrodes 941A of the first pixel PX1, the thickness of the first electrode 941C of the third pixel PX3, and the thickness of the first electrode 941D of the fourth pixel PX4 are larger than the thickness of the first electrode 941B of the second pixel PX2, the present disclosure is not limited thereto. For example, the thickness of the first electrodes 941A of the first pixel PX1, the thickness of the first electrode 941C of the third pixel PX3, and the thickness of the first electrode 941D of the fourth pixel PX4 can be smaller than the thickness of the first electrode 941B of the second pixel PX2.

The organic light emitting display apparatus 900 according to another exemplary embodiment of the present disclosure configures the thickness of the first electrode 941A of the first pixel PX1 to be different from the thickness of the first electrode 941B of the second pixel PX2, so that the color viewing angle characteristic can be improved. Further, the thickness of the first electrode 941B of the second pixel PX2 and the thickness of the first electrode 941C of the third pixel PX3 are configured to be different so that the luminance viewing angle characteristic can be improved.

Further, the thickness of the first electrode 941A of the first pixel PX1, the thickness of the first electrode 941C of the third pixel PX3, and the thickness of the first electrode 941D of the fourth pixel PX4 can be configured to be equal to one another. For example, the first electrodes 941A, 941B, 941C, and 941D of the organic light emitting display apparatus 900 can be formed by performing the photo process two times. Accordingly, the photo process can be minimized and a micro cavity structure optimized for every pixel PX1, PX2, PX3, PX4 can also be applied.

Figure 10:
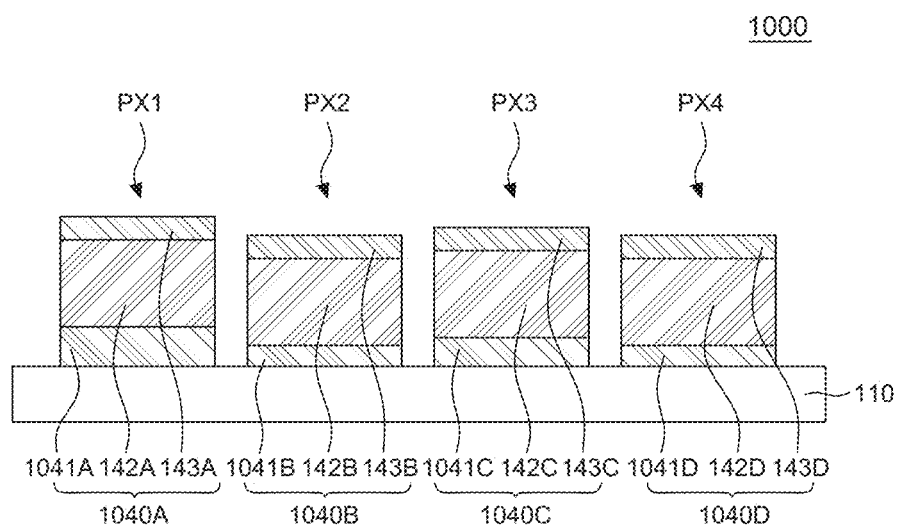

FIG. 10 is a schematic cross-sectional view of an organic light emitting display apparatus according to another exemplary embodiment of the present disclosure. An organic light emitting display apparatus 1000 of FIG. 10 is substantially the same as the organic light emitting display apparatus 100 of FIG. 4 except for a thickness relationship of a first electrode 1041A of a first pixel PX1, a first electrode 1041B of a second pixel PX2, a first electrode 1041C of a third pixel PX3, and a first electrode 1041D of a fourth pixel PX4 so that a redundant description will be omitted.

With reference to FIG. 10, the organic light emitting display apparatus 1000 includes a first organic light emitting diode 1040A corresponding to the first pixel PX1, a second organic light emitting diode 1040B corresponding to the second pixel PX2, a third organic light emitting diode 1040C corresponding to the third pixel PX3, and a fourth organic light emitting diode 1040D corresponding to the fourth pixel PX4. For example, the first pixel PX1 can be a white pixel, the second pixel PX2 can be a red pixel, the third pixel PX3 can be a green pixel, and the fourth pixel PX4 can be a blue pixel. For example, light emitted from the first organic light emitting diode 1040A is white light, white light emitted from the second organic light emitting diode 1040B can be converted into red light by the color filter 130. The white light emitted from the third organic light emitting diode 1040C can be converted into green light by the color filter 130 and the white light emitted from the fourth organic light emitting diode 1040D can be converted into blue light by the color filter 130.

A thickness of the first electrode 1041A of the first pixel PX1, a thickness of the first electrode 1041B of the second pixel PX2, and a thickness of the first electrode 1041C of the third pixel PX3 can be different from one another. The thickness of the first electrode 1041B of the second pixel PX2 can be equal to the thickness of the first electrode 1041D of the fourth pixel PX4. For example, the thickness of the first electrode 1041A of the first pixel PX1 and the thickness of the first electrode 1041B of the second pixel PX2 are configured to be different, so that the color viewing angle characteristic of the organic light emitting display apparatus 1000 can be improved. Further, the thickness of the first electrode 1041B of the second pixel PX2 and the thickness of the first electrode 1041C of the third pixel PX3 are configured to be different, so that the luminance viewing angle characteristic of the organic light emitting display apparatus 1000 can be improved.

Here, when the thickness of the first hole transport layer 211 is 100 Å to 1000 Å, the thickness of the first electrode 1041A is 200 Å to 1600 Å or 2000 Å to 2400 Å. Further, the thickness of the first electrode 1041B is 200 Å to 1000 Å or 1700 Å to 2400 Å, the thickness of the first electrode 1041C is 800 Å to 1600 Å, and the thickness of the first electrode 1041D is 200 Å to 1000 Å or 1200 Å to 2000 Å, or 2200 Å to 2400 Å. When the thickness of the first hole transport layer 211 is 1000 Å to 2200 Å, the thickness of the first electrode 1041A is 100 Å to 600 Å or 1000 Å to 1800 Å. Further, the thickness of the first electrode 1041B is 200 Å to 1200 Å or 1600 Å to 2400 Å, the thickness of the first electrode 1041C is 100 Å to 600 Å or 1200 Å to 2200 Å, and the thickness of the first electrode 1041D is 100 Å to 600 Å or 1200 Å to 2000 Å.

In the meantime, even though in FIG. 10, it is illustrated that the thickness of the first electrodes 1041A of the first pixel PX1, the thickness of the first electrode 1041C of the third pixel PX3, and the thicknesses of the first electrodes 1041B and 1041D of the second pixel PX2 and the fourth pixel PX4 are reduced in this order, the present disclosure is not limited thereto.

The organic light emitting display apparatus 1000 according to another exemplary embodiment of the present disclosure configures the thickness of the first electrode 1041A of the first pixel PX1 to be different from the thickness of the first electrode 1041B of the second pixel PX2, so that the color viewing angle characteristic can be improved. Further, the thickness of the first electrode 1041B of the second pixel PX2 and the thickness of the first electrode 1041C of the third pixel PX3 are configured to be different so that the luminance viewing angle characteristic can be improved.

Further, the thicknesses of the first electrode 1041A of the first pixel PX1 and the first electrode 1041C of the third pixel PX3 can be configured to be different from each other and the thicknesses of the first electrode 1041B of the second pixel PX2 and the first electrode 1041D of the fourth pixel PX4 can be configured to be equal to each other. For example, the first electrodes 1041A, 1041B, 1041C, and 1041D of the organic light emitting display apparatus 1000 can be formed to have three types of thicknesses for each of pixels PX1, PX2, PX3, and PX4 by performing a photo process three times. Accordingly, the photo process can be minimized and various thicknesses are also applied for each of the pixels PX1, PX2, PX3, and PX4 so that a more optimized micro cavity structure can be implemented.

Figure 11:
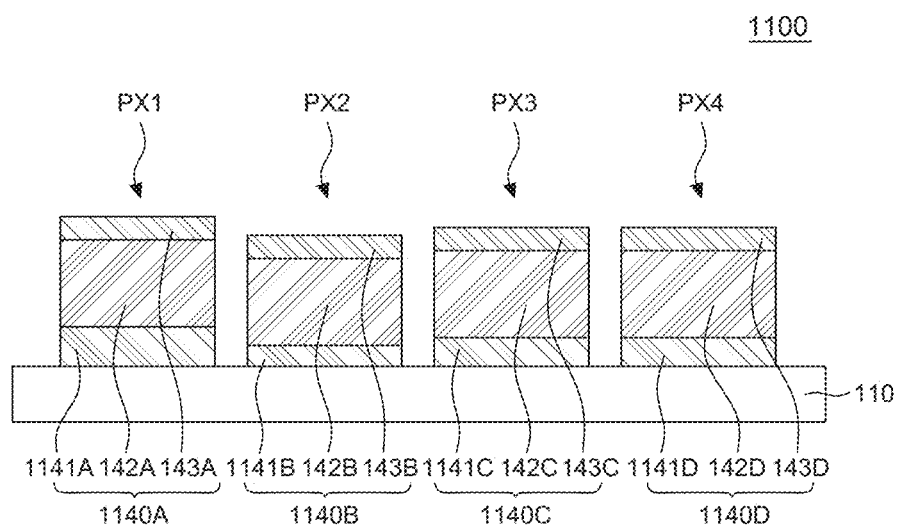

FIG. 11 is a schematic cross-sectional view of an organic light emitting display apparatus according to another exemplary embodiment of the present disclosure. An organic light emitting display apparatus 1100 of FIG. 11 is substantially the same as the organic light emitting display apparatus 100 of FIG. 4 except for a thickness relationship of a first electrode 1141A of a first pixel PX1, a first electrode 1141B of a second pixel PX2, a first electrode 1141C of a third pixel PX3, and a first electrode 1141D of a fourth pixel PX4 so that a redundant description will be omitted.

With reference to FIG. 11, the organic light emitting display apparatus 1100 includes a first organic light emitting diode 1140A corresponding to the first pixel PX1, a second organic light emitting diode 1140B corresponding to the second pixel PX2, a third organic light emitting diode 1140C corresponding to the third pixel PX3, and a fourth organic light emitting diode 1140D corresponding to the fourth pixel PX4. For example, the first pixel PX1 can be a white pixel, the second pixel PX2 can be a red pixel, the third pixel PX3 can be a green pixel, and the fourth pixel PX4 can be a blue pixel. For example, light emitted from the first organic light emitting diode 1140A is white light, white light emitted from the second organic light emitting diode 1140B can be converted into red light by the color filter 130. The white light emitted from the third organic light emitting diode 1140C can be converted into green light by the color filter 130 and the white light emitted from the fourth organic light emitting diode 1140D can be converted into blue light by the color filter 130.

A thickness of the first electrode 1141A of the first pixel PX1, a thickness of the first electrode 1141B of the second pixel PX2, and a thickness of the first electrode 1141C of the third pixel PX3 can be different from one another. The thickness of the first electrode 1141C of the third pixel PX3 can be equal to the thickness of the first electrode 1141D of the fourth pixel PX4. For example, the thickness of the first electrode 1141A of the first pixel PX1 and the thickness of the first electrode 1141B of the second pixel PX2 are configured to be different, so that the color viewing angle characteristic of the organic light emitting display apparatus 1100 can be improved. Further, the thickness of the first electrode 1141B of the second pixel PX2 and the thickness of the first electrode 1141C of the third pixel PX3 are configured to be different, so that the luminance viewing angle characteristic of the organic light emitting display apparatus 1100 can be improved.

Here, when the thickness of the first hole transport layer 211 is 100 Å to 1000 Å, the thickness of the first electrode 1141A is 200 Å to 1600 Å or 2000 Å to 2400 Å. Further, the thickness of the first electrode 1141B is 200 Å to 1000 Å or 1700 Å to 2400 Å, the thickness of the first electrode 1141C is 800 Å to 1600 Å, and the thickness of the first electrode 1141D is 200 Å to 1000 Å or 1200 Å to 2000 Å, or 2200 Å to 2400 Å. When the thickness of the first hole transport layer 211 is 1000 Å to 2200 Å, the thickness of the first electrode 1141A is 100 Å to 600 Å or 1000 Å to 1800 Å. Further, the thickness of the first electrode 1141B is 200 Å to 1200 Å or 1600 Å to 2400 Å, the thickness of the first electrode 1141C is 100 Å to 600 Å or 1200 Å to 2200 Å, and the thickness of the first electrode 1141D is 100 Å to 600 Å or 1200 Å to 2000 Å.

In the meantime, even though in FIG. 11, it is illustrated that the thickness of the first electrodes 1141A of the first pixel PX1, the thicknesses of the first electrodes 1141C and 1141D of the third pixel PX3 and the fourth pixel PX4, and the thickness of the first electrode 1141B of the second pixel PX2 are reduced in this order, the present disclosure is not limited thereto.

The organic light emitting display apparatus 1100 according to another exemplary embodiment of the present disclosure is configured to have the thickness of the first electrode 1141A of the first pixel PX1 to be different from the thickness of the first electrode 1141B of the second pixel PX2, so that the color viewing angle characteristic can be improved. Further, the thickness of the first electrode 1141B of the second pixel PX2 and the thickness of the first electrode 1141C of the third pixel PX3 are configured to be different so that the luminance viewing angle characteristic can be improved.

Further, the thicknesses of the first electrode 1141A of the first pixel PX1 and the first electrode 1141C of the third pixel PX3 can be configured to be different from each other and the thicknesses of the first electrode 1141C of the third pixel PX3 and the first electrode 1141D of the fourth pixel PX4 can be configured to be equal to each other. For example, the first electrodes 1141A, 1141B, 1141C, and 1141D of the organic light emitting display apparatus 1100 can be formed to have three types of thicknesses for each of pixels PX1, PX2, PX3, and PX4 by performing a photo process three times. Accordingly, the photo process can be minimized and various thicknesses are also applied for each of the pixels PX1, PX2, PX3, and PX4 so that a more optimized micro cavity structure can be implemented.

Figure 12:
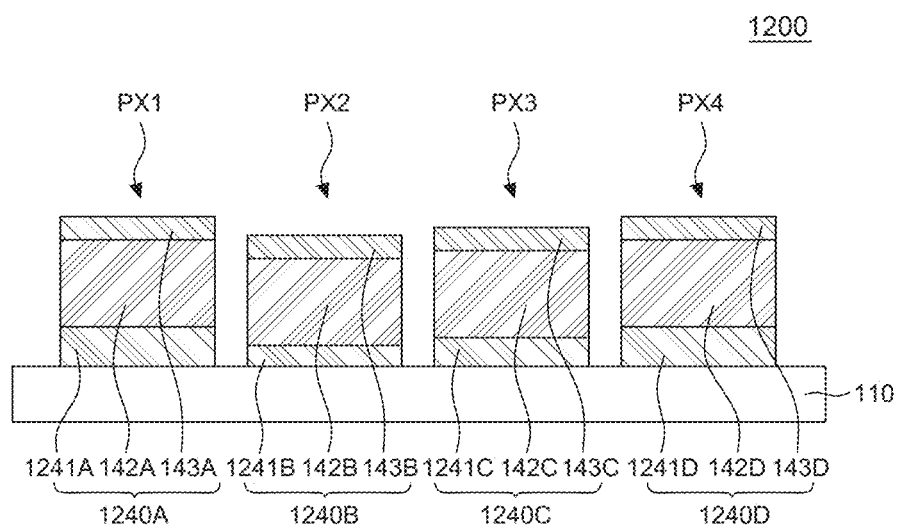

FIG. 12 is a schematic cross-sectional view of an organic light emitting display apparatus according to another exemplary embodiment of the present disclosure. An organic light emitting display apparatus 1200 of FIG. 12 is substantially the same as the organic light emitting display apparatus 100 of FIG. 4 except for a thickness relationship of a first electrode 1241A of a first pixel PX1, a first electrode 1241B of a second pixel PX2, a first electrode 1241C of a third pixel PX3, and a first electrode 1241D of a fourth pixel PX4 so that a redundant description will be omitted.

With reference to FIG. 12, the organic light emitting display apparatus 1200 includes a first organic light emitting diode 1240A corresponding to the first pixel PX1, a second organic light emitting diode 1240B corresponding to the second pixel PX2, a third organic light emitting diode 1240C corresponding to the third pixel PX3, and a fourth organic light emitting diode 1240D corresponding to the fourth pixel PX4. For example, the first pixel PX1 can be a white pixel, the second pixel PX2 can be a red pixel, the third pixel PX3 can be a green pixel, and the fourth pixel PX4 can be a blue pixel. For example, light emitted from the first organic light emitting diode 1240A is white light, white light emitted from the second organic light emitting diode 1240B can be converted into red light by the color filter 130. The white light emitted from the third organic light emitting diode 1240C can be converted into green light by the color filter 130 and the white light emitted from the fourth organic light emitting diode 1240D can be converted into blue light by the color filter 130.

A thickness of the first electrode 1241A of the first pixel PX1, a thickness of the first electrode 1241B of the second pixel PX2, and a thickness of the first electrode 1241C of the third pixel PX3 can be different from one another. The thickness of the first electrode 1241A of the first pixel PX1 can be equal to a thickness of the first electrode 1241D of the fourth pixel PX4. For example, the thickness of the first electrode 1241A of the first pixel PX1 and the thickness of the first electrode 1241B of the second pixel PX2 are configured to be different, so that the color viewing angle characteristic of the organic light emitting display apparatus 1200 can be improved. Further, the thickness of the first electrode 1241B of the second pixel PX2 and the thickness of the first electrode 1241C of the third pixel PX3 are configured to be different, so that the luminance viewing angle characteristic of the organic light emitting display apparatus 1200 can be improved.

Here, when the thickness of the first hole transport layer 211 is 100 Å to 1000 Å, the thickness of the first electrode 1241A is 200 Å to 1600 Å or 2000 Å to 2400 Å. Further, the thickness of the first electrode 1241B is 200 Å to 1000 Å or 1700 Å to 2400 Å, the thickness of the first electrode 1241C is 800 Å to 1600 Å, and the thickness of the first electrode 1241D is 200 Å to 1000 Å or 1200 Å to 2000 Å, or 2200 Å to 2400 Å. When the thickness of the first hole transport layer 211 is 1000 Å to 2200 Å, the thickness of the first electrode 1241A is 100 Å to 600 Å or 1000 Å to 1800 Å. Further, the thickness of the first electrode 1241B is 200 Å to 1200 Å or 1600 Å to 2400 Å, the thickness of the first electrode 1241C is 100 Å to 600 Å or 1200 Å to 2200 Å, and the thickness of the first electrode 1241D is 100 Å to 600 Å or 1200 Å to 2000 Å.

In the meantime, even though in FIG. 12, it is illustrated that the thicknesses of the first electrodes 1241A and 1241D of the first pixel PX1 and the fourth pixel PX4, the thickness of the first electrodes 1241C of the third pixel PX3, and the thickness of the first electrode 1241B of the second pixel PX2 are reduced in this order, the present disclosure is not limited thereto.

The organic light emitting display apparatus 1200 according to another exemplary embodiment of the present disclosure is configure to have the thickness of the first electrode 1241A of the first pixel PX1 to be different from the thickness of the first electrode 1241B of the second pixel PX2, so that the color viewing angle characteristic can be improved. Further, the thickness of the first electrode 1241B of the second pixel PX2 and the thickness of the first electrode 1241C of the third pixel PX3 are configured to be different so that the luminance viewing angle characteristic can be improved.

Further, the thicknesses of the first electrode 1241A of the first pixel PX1 and the first electrode 1241C of the third pixel PX3 can be configured to be different from each other and the thicknesses of the first electrode 1241A of the first pixel PX1 and the first electrode 1241D of the fourth pixel PX4 can be configured to be equal to each other. For example, the first electrodes 1241A, 1241B, 1241C, and 1241D of the organic light emitting display apparatus 1200 can be formed to have three types of thicknesses for each of pixels PX1, PX2, PX3, and PX4 by performing a photo process three times. Accordingly, the photo process can be minimized and various thicknesses are also applied for each of the pixels PX1, PX2, PX3, and PX4 so that a more optimized micro cavity structure can be implemented.

Figure 13:
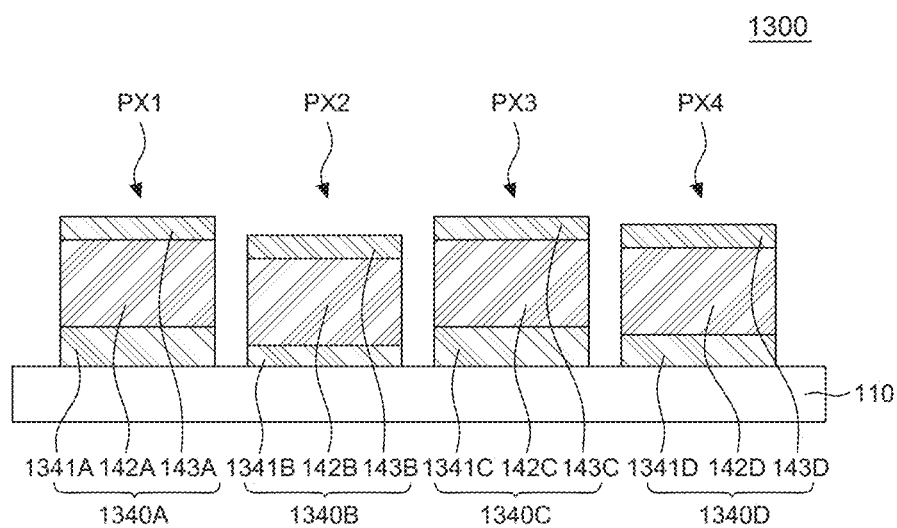

FIG. 13 is a schematic cross-sectional view of an organic light emitting display apparatus according to another exemplary embodiment of the present disclosure. An organic light emitting display apparatus 1300 of FIG. 13 is substantially the same as the organic light emitting display apparatus 100 of FIG. 4 except for a thickness relationship of a first electrode 1341A of a first pixel PX1, a first electrode 1341B of a second pixel PX2, a first electrode 1341C of a third pixel PX3, and a first electrode 1341D of a fourth pixel PX4 so that a redundant description will be omitted.

With reference to FIG. 13, the organic light emitting display apparatus 1300 includes a first organic light emitting diode 1340A corresponding to the first pixel PX1, a second organic light emitting diode 1340B corresponding to the second pixel PX2, a third organic light emitting diode 1340C corresponding to the third pixel PX3, and a fourth organic light emitting diode 1340D corresponding to the fourth pixel PX4. For example, the first pixel PX1 can be a white pixel, the second pixel PX2 can be a red pixel, the third pixel PX3 can be a green pixel, and the fourth pixel PX4 can be a blue pixel. For example, light emitted from the first organic light emitting diode 1340A is white light, white light emitted from the second organic light emitting diode 1340B can be converted into red light by the color filter 130. The white light emitted from the third organic light emitting diode 1340C can be converted into green light by the color filter 130 and the white light emitted from the fourth organic light emitting diode 1340D can be converted into blue light by the color filter 130.

A thickness of the first electrode 1341A of the first pixel PX1, a thickness of the first electrode 1341B of the second pixel PX2, and a thickness of the first electrode 1341D of the fourth pixel PX4 can be different from one another. The thickness of the first electrode 1341A of the first pixel PX1 can be equal to a thickness of the first electrode 1341C of the third pixel PX3. For example, the thickness of the first electrode 1341A of the first pixel PX1 and the thickness of the first electrode 1341B of the second pixel PX2 are configured to be different, so that the color viewing angle characteristic of the organic light emitting display apparatus 1300 can be improved. Further, the thickness of the first electrode 1341B of the second pixel PX2 and the thickness of the first electrode 1341C of the third pixel PX3 are configured to be different, so that the luminance viewing angle characteristic of the organic light emitting display apparatus 1300 can be improved.

Here, when the thickness of the first hole transport layer 211 is 100 Å to 1000 Å, the thickness of the first electrode 1341A is 200 Å to 1600 Å or 2000 Å to 2400 Å. Further, the thickness of the first electrode 1341B is 200 Å to 1000 Å or 1700 Å to 2400 Å, the thickness of the first electrode 1341C is 800 Å to 1600 Å, and the thickness of the first electrode 1341D is 200 Å to 1000 Å or 1200 Å to 2000 Å, or 2200 Å to 2400 Å. When the thickness of the first hole transport layer 211 is 1000 Å to 2200 Å, the thickness of the first electrode 1341A is 100 Å to 600 Å or 1000 Å to 1800 Å. Further, the thickness of the first electrode 1341B is 200 Å to 1200 Å or 1600 Å to 2400 Å, the thickness of the first electrode 1341C is 100 Å to 600 Å or 1200 Å to 2200 Å, and the thickness of the first electrode 1341D is 100 Å to 600 Å or 1200 Å to 2000 Å.

In the meantime, even though in FIG. 13, it is illustrated that the thicknesses of the first electrodes 1341A and 1341C of the first pixel PX1 and the third pixel PX3, the thickness of the first electrodes 1341D of the fourth pixel PX4, and the thickness of the first electrode 1341B of the second pixel PX2 are reduced in this order, the present disclosure is not limited thereto.

The organic light emitting display apparatus 1300 according to another exemplary embodiment of the present disclosure is configure to have the thickness of the first electrode 1341A of the first pixel PX1 to be different from the thickness of the first electrode 1341B of the second pixel PX2, so that the color viewing angle characteristic can be improved. Further, the thickness of the first electrode 1341B of the second pixel PX2 and the thickness of the first electrode 1341C of the third pixel PX3 are configured to be different so that the luminance viewing angle characteristic can be improved.

Further, the thicknesses of the first electrode 1341A of the first pixel PX1 and the first electrode 1341C of the third pixel PX3 can be configured to be equal to each other. Further, the thickness of the first electrodes 1341A of the first pixel PX1, the thickness of the first electrode 1341B of the second pixel PX2, and the thickness of the first electrode 1341D of the fourth pixel PX4 can be configured to be different from one another. For example, the first electrodes 1341A, 1341B, 1341C, and 1341D of the organic light emitting display apparatus 1300 can be formed to have three types of thicknesses for each of pixels PX1, PX2, PX3, and PX4 by performing a photo process three times. Accordingly, the photo process can be minimized and various thicknesses are also applied for each of the pixels PX1, PX2, PX3, and PX4 so that a more optimized micro cavity structure can be implemented.

Figure 14:
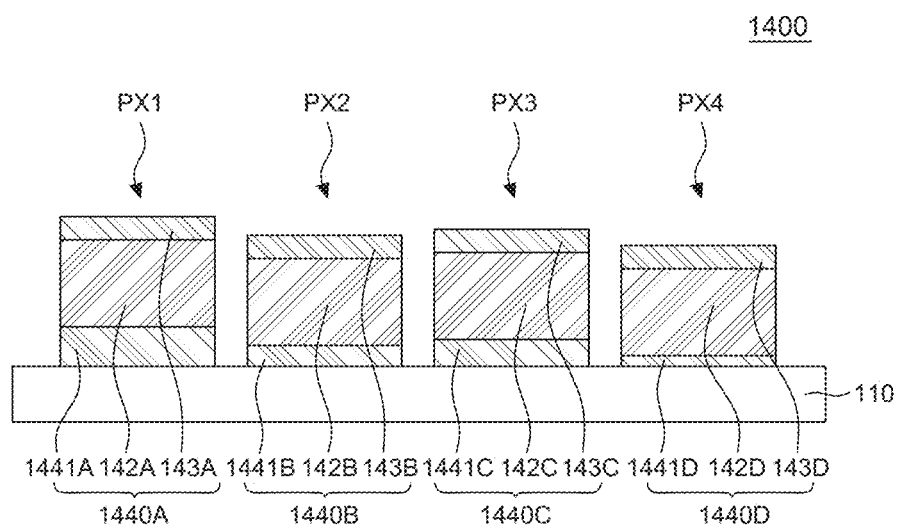

FIG. 14 is a schematic cross-sectional view of an organic light emitting display apparatus according to another exemplary embodiment of the present disclosure. An organic light emitting display apparatus 1400 of FIG. 14 is substantially the same as the organic light emitting display apparatus 100 of FIG. 4 except for a thickness relationship pf a first electrode 1441A of a first pixel PX1, a first electrode 1441B of a second pixel PX2, a first electrode 1441C of a third pixel PX3, and a first electrode 1441D of a fourth pixel PX4 so that a redundant description will be omitted.

With reference to FIG. 14, the organic light emitting display apparatus 1400 includes a first organic light emitting diode 1440A corresponding to the first pixel PX1, a second organic light emitting diode 1440B corresponding to the second pixel PX2, a third organic light emitting diode 1440C corresponding to the third pixel PX3, and a fourth organic light emitting diode 1440D corresponding to the fourth pixel PX4. For example, the first pixel PX1 can be a white pixel, the second pixel PX2 can be a red pixel, the third pixel PX3 can be a green pixel, and the fourth pixel PX4 can be a blue pixel. For example, light emitted from the first organic light emitting diode 1440A is white light, white light emitted from the second organic light emitting diode 1440B can be converted into red light by the color filter 130. The white light emitted from the third organic light emitting diode 1440C can be converted into green light by the color filter 130 and the white light emitted from the fourth organic light emitting diode 1440D can be converted into blue light by the color filter 130.

A thickness of the first electrode 1441A of the first pixel PX1, a thickness of the first electrode 1441B of the second pixel PX2, a thickness of the first electrode 1441C of the third pixel PX3, and a thickness of the first electrode 1441D of the fourth pixel PX4 can be different from one another. For example, the thickness of the first electrode 1441A of the first pixel PX1 and the thickness of the first electrode 1441B of the second pixel PX2 are configured to be different, so that the color viewing angle characteristic of the organic light emitting display apparatus 1400 can be improved. Further, the thickness of the first electrode 1441B of the second pixel PX2 and the thickness of the first electrode 1441C of the third pixel PX3 are configured to be different, so that the luminance viewing angle characteristic of the organic light emitting display apparatus 1400 can be improved.

Here, when the thickness of the first hole transport layer 211 is 100 Å to 1000 Å, the thickness of the first electrode 1441A is 200 Å to 1600 Å or 2000 Å to 2400 Å. Further, the thickness of the first electrode 1441B is 200 Å to 1000 Å or 1700 Å to 2400 Å, the thickness of the first electrode 1441C is 800 Å to 1600 Å, and the thickness of the first electrode 1441D is 200 Å to 1000 Å or 1200 Å to 2000 Å, or 2200 Å to 2400 Å. When the thickness of the first hole transport layer 211 is 1000 Å to 2200 Å, the thickness of the first electrode 1441A is 100 Å to 600 Å or 1000 Å to 1800 Å. Further, the thickness of the first electrode 1441B is 200 Å to 1200 Å or 1600 Å to 2400 Å, the thickness of the first electrode 1441C is 100 Å to 600 Å or 1200 Å to 2200 Å, and the thickness of the first electrode 1441D is 100 Å to 600 Å or 1200 Å to 2000 Å.

In the meantime, even though in FIG. 14, it is illustrated that the thickness of the first electrodes 1441A of the first pixel PX1, the thickness of the first electrode 1441C of the third pixel PX3, the thickness of the first electrode 1441B of the second pixel PX2, and the thickness of the first electrode 1441D of the fourth pixel PX4 are reduced in this order, the present disclosure is not limited thereto.

The organic light emitting display apparatus 1400 according to another exemplary embodiment of the present disclosure configures the thickness of the first electrode 1441A of the first pixel PX1 to be different from the thickness of the first electrode 1441B of the second pixel PX2, so that the color viewing angle characteristic can be improved. Further, the thickness of the first electrode 1441B of the second pixel PX2 and the thickness of the first electrode 1441C of the third pixel PX3 are configured to be different so that the luminance viewing angle characteristic can be improved.

Further, the thicknesses of the first electrodes 1441A, 1441B, 1441C, and 1441D of the first pixel PX1, the second pixel PX2, the third pixel PX3, and the fourth pixel PX4 can be configured to be different from one another. For example, the thicknesses of the first electrodes 1441A, 1441B, 1441C, and 1441D more optimized for each of the first pixel PX1, the second pixel PX2, the third pixel PX3, and the fourth pixel PX4 of the organic light emitting display apparatus 1400 can be set. Accordingly, an effect by the micro cavity of the organic light emitting display apparatus 1400 can be improved.

The exemplary embodiments of the present disclosure can also be described as follows:

An organic light emitting display apparatus according to an embodiment of the present disclosure includes a substrate including a plurality of pixels. The organic light emitting display apparatus further includes a plurality of organic light emitting diodes disposed on the substrate so as to correspond to the plurality of pixels. The plurality of pixels includes a first pixel, a second pixel, a third pixel, and a fourth pixel which emit different color light. Each of the plurality of organic light emitting diodes includes a first electrode, a light emitting portion on the first electrode and a second electrode on the light emitting portion. A thickness of the first electrode of the first pixel is different from a thickness of the first electrode of the second pixel, and the thickness of the first electrode of the second pixel is different from a thickness of the first electrode of the third pixel.

According to some embodiments of the present disclosure, the first pixel can be a white pixel, the second pixel can be a red pixel, the third pixel can be a green pixel, and the fourth pixel can be a blue pixel.

According to some embodiments of the present disclosure, the thickness of the first electrode of the first pixel can be equal to the thickness of the first electrode of the third pixel, and the thickness of the first electrode of the second pixel can be equal to a thickness of the first electrode of the fourth pixel.

According to some embodiments of the present disclosure, the thickness of the first electrode of the first pixel, the thickness of the first electrode of the third pixel, and a thickness of the first electrode of the fourth pixel can be equal to one another.

According to some embodiments of the present disclosure, the thickness of the first electrode of the first pixel can be different from the thickness of the first electrode of the third pixel, and the thickness of the first electrode of the second pixel can be equal to a thickness of the first electrode of the fourth pixel.

According to some embodiments of the present disclosure, the thickness of the first electrode of the first pixel can be different from the thickness of the first electrode of the third pixel, and the thickness of the third pixel can be equal to a thickness of the first electrode of the fourth pixel.

According to some embodiments of the present disclosure, the thickness of the first electrode of the first pixel can be different from the thickness of the first electrode of the third pixel, and the thickness of the first electrode of the first pixel can be equal to a thickness of the first electrode of the fourth pixel.

According to some embodiments of the present disclosure, the thickness of the first electrode of the first pixel can be equal to the thickness of the first electrode of the third pixel, and the thickness of the first electrode of the first pixel, the thickness of the first electrode of the second pixel, and a thickness of the first electrode of the fourth pixel can be different from one another.

According to some embodiments of the present disclosure, the thicknesses of the first electrodes of the first pixel, the second pixel, the third pixel, and the fourth pixel can be different from one another.

According to some embodiments of the present disclosure, the light emitting portion can include a hole transport layer disposed on the first electrode and a thickness of the hole transport layer can be 100 Å to 2200 Å.

According to some embodiments of the present disclosure, when the thickness of the hole transport layer can be 100 Å to 1000 Å, the thickness of the first electrode of the first pixel can be 200 Å to 1600 Å or 2000 Å to 2400 Å, the thickness of the first electrode of the second pixel can be 200 Å to 1000 Å or 1700 Å to 2400 Å, the thickness of the first electrode of the third pixel can be 800 Å to 1600 Å, and a thickness of the first electrode of the fourth pixel can be 200 Å to 1000 Å or 1200 Å to 2000 Å, or 2200 Å to 2400 Å.

According to some embodiments of the present disclosure, when the thickness of the hole transport layer can be 1000 Å to 2200 Å, the thickness of the first electrode of the first pixel can be 100 Å to 600 Å or 1000 Å to 1800 Å, the thickness of the first electrode of the second pixel can be 200 Å to 1200 Å or 1600 Å to 2400 Å, the thickness of the first electrode of the third pixel can be 100 Å to 600 Å or 1200 Å to 2200 Å, and a thickness of the first electrode of the fourth pixel can be 100 Å to 600 Å or 1200 Å to 2000 Å.

According to some embodiments of the present disclosure, the light emitting portion can include a first light emitting portion on the first electrode and including a blue light emitting layer, a second light emitting portion on the first light emitting portion and including a red light emitting layer and two yellow-green light emitting layers, and a third light emitting portion on the second light emitting portion and including a blue light emitting layer.

According to some embodiments of the present disclosure, a thickness of the first light emitting portion can be 400 Å to 3100 Å, a thickness of the second light emitting portion can be 750 Å to 1350 Å, a thickness of the third light emitting portion can be 1200 Å to 1800 Å, a distance between a center of the blue light emitting layer of the first light emitting portion and the second electrode can be 2500 Å to 3100 Å, a distance between a center of the red light emitting layer of the second light emitting portion and the second electrode can be 2000 Å to 2600 Å, a distance between a boundary of the two yellow-green light emitting layers of the second light emitting portion and the second electrode can be 1700 Å to 2300 Å, and a distance between a center of the blue light emitting layer of the third light emitting portion and the second electrode can be 100 Å to 700 Å, According to some embodiments of the present disclosure, the first electrode can include a transparent conductive material, and the second electrode can include a metal material.

An organic light emitting display apparatus according to another embodiment of the present disclosure includes a substrate including a plurality of pixels. The organic light emitting display apparatus further includes a plurality of organic light emitting diodes disposed on the substrate so as to correspond to the plurality of pixels. The plurality of pixels includes a white pixel, a red pixel, a green pixel, and a blue pixel. Each of the plurality of organic light emitting diodes includes a first electrode, a first light emitting portion on the first electrode and including a blue light emitting layer, a second light emitting portion on the first light emitting portion and including a red light emitting layer and two yellow-green light emitting layers, a third light emitting portion on the second light emitting portion and including a blue light emitting layer and a second electrode on the third light emitting portion. A thickness of the first electrode of the white pixel is different from a thickness of the first electrode of the red pixel, and the thickness of the first electrode of the red pixel is different from a thickness of the first electrode of the green pixel.

According to some embodiments of the present disclosure, the first light emitting portion can include a hole transport layer on the first electrode and a thickness of the hole transport layer is 100 Å to 2200 Å.

According to some embodiments of the present disclosure, when the thickness of the hole transport layer can be 100 Å to 1000 Å, the thickness of the first electrode of the white pixel can be 200 Å to 1600 Å or 2000 Å to 2400 Å, the thickness of the first electrode of the red pixel can be 200 Å to 1000 Å or 1700 Å to 2400 Å, the thickness of the first electrode of the green pixel can be 800 Å to 1600 Å, and a thickness of the first electrode of the blue pixel can be 200 Å to 1000 Å or 1200 Å to 2000 Å, or 2200 Å to 2400 Å.

According to some embodiments of the present disclosure, when the thickness of the hole transport layer can be 1000 Å to 2200 Å, the thickness of the first electrode of the white pixel can be 100 Å to 600 Å or 1000 Å to 1800 Å, the thickness of the first electrode of the red pixel can be 200 Å to 1200 Å or 1600 Å to 2400 Å, the thickness of the first electrode of the green pixel can be 100 Å to 600 Å or 1200 Å to 2200 Å, and a thickness of the first electrode of the blue pixel can be 100 Å to 600 Å or 1200 Å to 2000 Å.

According to another embodiment of the present disclosure, an organic light emitting display apparatus comprises: a substrate including a plurality of pixels; and a plurality of organic light emitting diodes disposed on the substrate so as to correspond to the plurality of pixels respectively, wherein the plurality of pixels includes a first pixel, a second pixel, a third pixel, and a fourth pixel, and emits different color lights, and each pixel of the plurality of pixels includes a micro cavity structure corresponding to the light emitted from the pixel, wherein each of the plurality of organic light emitting diodes includes a first electrode; a light emitting portion on the first electrode; and a second electrode on the light emitting portion, wherein the micro cavity structure of the first pixel is different from the micro cavity structure of the second pixel, and the micro cavity structure of the second pixel is different from the micro cavity structure of the third pixel.

It will be apparent to those skilled in the art that various modifications and variations can be made in the present disclosure without departing from the technical idea or scope of the disclosure. Thus, it can be intended that embodiments of the present disclosure cover the modifications and variations of the disclosure provided they come within the scope of the appended claims and their equivalents.

What is claimed is:

1. An organic light emitting display apparatus, comprising:
   a substrate including a plurality of pixels;
   a transistor disposed on the substrate and including a gate electrode, a source electrode, a drain electrode and an active layer;
   an over coating layer disposed on the transistor;

a plurality of organic light emitting diodes disposed on the over coating layer to correspond to the plurality of pixels;

an encapsulation layer disposed on the plurality of organic light emitting diodes and including at least an inorganic layer and at least an organic layer;

an adhesive member on the encapsulation layer; and an encapsulation substrate on the adhesive layer, wherein the plurality of pixels include at least a first pixel, a second pixel, a third pixel, and emit different color lights, wherein each of the plurality of organic light emitting diodes includes:
 a first electrode disposed on the over coating layer;
 a light emitting portion disposed on the first electrode; and
 a second electrode on the light emitting portion, wherein the light emitting portion includes a hole transport layer, wherein a total thickness of the hole transport layer is approximately 100 Å to 2200 Å, wherein the light emitting portion includes a first light emitting portion including a first light emitting layer emitting blue color light, wherein a total thickness of the first light emitting portion is approximately 400 Å to 3100 Å, wherein a distance between a center of the first light emitting layer and a first surface of the second electrode is approximately 2500 Å to 3100 Å, wherein the light emitting portion includes a second light emitting portion, and wherein a total thickness of the second light emitting portion is approximately 750 Å to 1350 Å.

2. The organic light emitting display apparatus according to claim 1, wherein a thickness of the first electrode of the first pixel is different from a thickness of the first electrode of the second pixel, and the thickness of the first electrode of the second pixel is different from a thickness of the first electrode of the third pixel.

3. The organic light emitting display apparatus according to claim 1, wherein the first light emitting layer is a fluorescent emitting layer.

4. The organic light emitting display apparatus according to claim 1, wherein the emitting portion includes a phosphorescent emitting layer.

5. The organic light emitting display apparatus according to claim 1, wherein the second emitting portion further includes a second light emitting layer emitting different color light from the color of the first light emitting layer of the first light emitting portion.

6. The organic light emitting display apparatus according to claim 1, wherein the second light emitting portion further includes a second light emitting layer emitting color light at least one of red, yellow or green.

7. The organic light emitting display apparatus according to claim 1, further comprising:
 a bank disposed on the first electrode and the over coating layer and covering an edge or periphery of the first electrode.

8. The organic light emitting display apparatus according to claim 1, wherein the plurality of pixels further includes a fourth pixel,
 wherein the thickness of the first electrode of the first pixel is equal to the thickness of the first electrode of the third pixel, and wherein the thickness of the first electrode of the second pixel is equal to a thickness of the first electrode of the fourth pixel.

9. The organic light emitting display apparatus according to claim 1, wherein the plurality of pixels further includes a fourth pixel, and
 wherein the thickness of the first electrode of the first pixel, the thickness of the first electrode of the third pixel, and a thickness of the first electrode of the fourth pixel are equal to one another.

10. The organic light emitting display apparatus according to claim 1, wherein the plurality of pixels further includes a fourth pixel,
 wherein the thickness of the first electrode of the first pixel is different from the thickness of the first electrode of the third pixel, and
 wherein the thickness of the first electrode of the second pixel is equal to a thickness of the first electrode of the fourth pixel.

11. The organic light emitting display apparatus according to claim 1, wherein the plurality of pixels further includes a fourth pixel,
 wherein the thickness of the first electrode of the first pixel is different from the thickness of the first electrode of the third pixel, and
 wherein the thickness of the first electrode of the third pixel is equal to a thickness of the first electrode of the fourth pixel.

12. The organic light emitting display apparatus according to claim 1, wherein the plurality of pixels further includes a fourth pixel,
 wherein the thickness of the first electrode of the first pixel is different from the thickness of the first electrode of the third pixel, and
 wherein the thickness of the first electrode of the first pixel is equal to a thickness of the first electrode of the fourth pixel.

13. The organic light emitting display apparatus according to claim 1, wherein the plurality of pixels further includes a fourth pixel,
 wherein the thickness of the first electrode of the first pixel is equal to the thickness of the first electrode of the third pixel, and
 wherein the thickness of the first electrode of the first pixel, the thickness of the first electrode of the second pixel, and a thickness of the first electrode of the fourth pixel are different from one another.

14. The organic light emitting display apparatus according to claim 1, wherein the plurality of pixels further includes a fourth pixel, and
 wherein the thicknesses of the first electrodes of the first pixel, the second pixel, the third pixel, and the fourth pixel are different from one another.

15. The organic light emitting display apparatus according to claim 1, wherein the plurality of pixels further includes a fourth pixel, and
 wherein when the thickness of the hole transport layer is approximately 100 Å to 1000 Å,
 the thickness of the first electrode of the first pixel is approximately 200 Å to 1600 Å or approximately 2000 Å to 2400 Å,
 the thickness of the first electrode of the second pixel is approximately 200 Å to 1000 Å or approximately 1700 Å to 2400 Å,
 the thickness of the first electrode of the third pixel is approximately 800 Å to 1600 Å, and a thickness of the first electrode of the fourth pixel is approximately 200 Å to 1000 Å or approximately 1200 Å to 2000 Å, or approximately 2200 Å to 2400 Å.

16. The organic light emitting display apparatus according to claim 1, wherein the plurality of pixels further includes a fourth pixel, and wherein when the thickness of the hole transport layer is approximately 1000 Å to 2200 Å, the thickness of the first electrode of the first pixel is approximately 100 Å to 600 Å or approximately 1000 Å to 1800 Å, the thickness of the first electrode of the second pixel is approximately 200 Å to 1200 Å or approximately 1600 Å to 2400 Å, the thickness of the first electrode of the third pixel is approximately 100 Å to 600 Å or approximately 1200 Å to 2200 Å, and a thickness of the first electrode of the fourth pixel is approximately 100 Å to 600 Å or approximately 1200 Å to 2000 Å.

17. The organic light emitting display apparatus according to claim 1, wherein the light emitting portion includes:

a first light emitting portion on the first electrode and including a blue light emitting layer;

a second light emitting portion on the first light emitting portion and including a red light emitting layer and two yellow-green light emitting layers; and a third light emitting portion on the second light emitting portion and including a blue light emitting layer.

18. The organic light emitting display apparatus according to claim 17, wherein a thickness of the first light emitting portion is approximately 400 Å to 3100 Å, a thickness of the second light emitting portion is approximately 750 Å to 1350 Å, a thickness of the third light emitting portion is approximately 1200 Å to 1800 Å, a distance between a center of the blue light emitting layer of the first light emitting portion and the second electrode is approximately 2500 Å to 3100 Å, a distance between a center of the red light emitting layer of the second light emitting portion and the second electrode is approximately 2000 Å to 2600 Å, a distance between a boundary of the two yellow-green light emitting layers of the second light emitting portion and the second electrode is approximately 1700 Å to 2300 Å, and a distance between a center of the blue light emitting layer of the third light emitting portion and the second electrode is approximately 100 Å to 700 Å.

19. The organic light emitting display apparatus according to claim 1, wherein the first electrode includes a transparent conductive material, and the second electrode includes a metal material.

* * * * *